(12) United States Patent
Xiao et al.

(10) Patent No.: US 12,137,550 B2
(45) Date of Patent: Nov. 5, 2024

(54) SEMICONDUCTOR STRUCTURE WITH A FIRST LOWER ELECTRODE LAYER AND A SECOND LOWER ELECTRODE LAYER AND METHOD FOR MANUFACTURING SAME

(71) Applicant: CHANGXIN MEMORY TECHNOLOGIES, INC., Hefei (CN)

(72) Inventors: Deyuan Xiao, Hefei (CN); Lixia Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 402 days.

(21) Appl. No.: 17/669,544

(22) Filed: Feb. 11, 2022

(65) Prior Publication Data

US 2023/0019891 A1 Jan. 19, 2023

Related U.S. Application Data

(63) Continuation of application No. PCT/CN2021/120429, filed on Sep. 24, 2021.

(30) Foreign Application Priority Data

Jul. 16, 2021 (CN) .......................... 202110807121.7

(51) Int. Cl.
  *H10B 12/00* (2023.01)
  *H01L 29/786* (2006.01)
(52) U.S. Cl.
  CPC ..... *H10B 12/315* (2023.02); *H01L 29/78642* (2013.01); *H01L 29/7869* (2013.01); *H10B 12/033* (2023.02); *H10B 12/05* (2023.02)
(58) Field of Classification Search
  None
  See application file for complete search history.

(56) References Cited

U.S. PATENT DOCUMENTS

| 5,627,390 A | 5/1997 | Maeda |
| 5,780,888 A | 7/1998 | Maeda |

(Continued)

FOREIGN PATENT DOCUMENTS

| CN | 1930686 A | 3/2007 |
| CN | 101090117 A | 12/2007 |

(Continued)

OTHER PUBLICATIONS

Supplementary European Search Report in the European application No. 21912333.8, mailed on Jul. 24, 2023, 8 pages.

(Continued)

*Primary Examiner* — Nduka E Ojeh
(74) *Attorney, Agent, or Firm* — Syncoda LLC; Feng Ma

(57) ABSTRACT

A semiconductor structure and a method for manufacturing same. The semiconductor structure includes a storage unit, which includes: a first dielectric layer and a metal bit line located therein; a semiconductor channel, located on the metal bit line; a word line, disposed surrounding part of the semiconductor channel; a second dielectric layer, located between the metal bit line and the word line, and on top of the word line; a first and a second lower electrode layers, stacked on the semiconductor channel, the first lower electrode layer contacting the top surface of the semiconductor channel; an upper electrode layer, located on top of the second lower electrode layer, and surrounding the first and the second lower electrode layers; and a capacitor dielectric layer, located between the upper electrode layer and the first lower electrode layer, and between the upper electrode layer and the second lower electrode layer.

16 Claims, 22 Drawing Sheets

(56) References Cited

U.S. PATENT DOCUMENTS

| | | |
|---|---|---|
| 5,994,735 A | 11/1999 | Maeda |
| 6,150,688 A | 11/2000 | Maeda |
| 6,303,425 B1 | 10/2001 | Maeda |
| 6,383,860 B2 | 5/2002 | Maeda |
| 6,544,834 B1 | 4/2003 | Sugawara |
| 7,262,089 B2 | 8/2007 | Abbott |
| 9,698,272 B1 | 7/2017 | Ikeda |
| 2001/0041438 A1* | 11/2001 | Maeda .............. H01L 29/78642 |
| | | 438/622 |
| 2005/0176210 A1 | 8/2005 | Kim |
| 2005/0199932 A1 | 9/2005 | Abbott |
| 2006/0081884 A1 | 4/2006 | Abbott |
| 2006/0186449 A1* | 8/2006 | Uchiyama ............ H10B 12/033 |
| | | 257/300 |
| 2006/0211178 A1 | 9/2006 | Kim |
| 2008/0061340 A1 | 3/2008 | Heineck |
| 2009/0087958 A1 | 4/2009 | Uchiyama |
| 2010/0052098 A1* | 3/2010 | Miyajima ............... H01L 28/60 |
| | | 257/532 |
| 2014/0231959 A1 | 8/2014 | Miyajima |
| 2017/0077230 A1 | 3/2017 | Ikeda |
| 2020/0091156 A1 | 3/2020 | Sharma et al. |
| 2020/0194434 A1* | 6/2020 | Alzate Vinasco ...... H01L 28/60 |
| 2020/0227416 A1 | 7/2020 | Lilak |
| 2022/0102352 A1* | 3/2022 | Lee ..................... H10B 12/315 |
| 2023/0255033 A1* | 8/2023 | Kobayashi ........ H01L 29/78391 |
| | | 257/295 |

FOREIGN PATENT DOCUMENTS

| | | |
|---|---|---|
| CN | 101140935 A | 3/2008 |
| CN | 111326514 A | 6/2020 |
| CN | 111968980 A | 11/2020 |
| JP | H0799311 A | 4/1995 |
| JP | H07321228 A | 12/1995 |
| JP | 2006216649 A | 8/2006 |
| JP | 2010034198 A | 2/2010 |
| JP | 2015111663 A | 6/2015 |
| JP | 2017059607 A | 3/2017 |
| JP | 2017168623 A | 9/2017 |
| KR | 930001739 B1 | 3/1993 |
| RU | 2669103 C2 | 10/2018 |
| WO | 9966558 A1 | 12/1999 |

OTHER PUBLICATIONS

International Search Report in the international application No. PCT/CN2021/120429, mailed on Apr. 13, 2022, 2 pages.
First Office Action of the Japanese application No. 2022-548072, issued on Oct. 3, 2023. 12 pages with English translation.
Notice of Allowance of the Russian application No. 2023114235, issued on Oct. 16, 2023. 31 pages with English translation.

* cited by examiner

# SEMICONDUCTOR STRUCTURE WITH A FIRST LOWER ELECTRODE LAYER AND A SECOND LOWER ELECTRODE LAYER AND METHOD FOR MANUFACTURING SAME

CROSS-REFERENCE TO RELATED APPLICATIONS

This application is a continuation application of International Application No. PCT/CN2021/120429, filed on Sep. 24, 2021, which claims priority to Chinese Patent Application No. 202110807121.7, entitled "SEMICONDUCTOR STRUCTURE AND METHOD FOR MANUFACTURING SAME" and filed on Jul. 16, 2021. The disclosures of International Application No. PCT/CN2021/120429 and Chinese Patent Application No. 202110807121.7 are hereby incorporated by reference in their entireties.

BACKGROUND

As the demand for semiconductor devices with high performance and low costs increases, the demand for semiconductor devices with high integration density and high storage capacity also increases.

However, as the integration density of a semiconductor device increases, while a capacitance of a capacitor in the semiconductor device is increased, an aspect ratio of the capacitor also becomes increasingly high. Restricted by process equipment and the size of a semiconductor device, a capacitor formed with a high aspect ratio has insufficient size precision, and as a result the electrical performance of the capacitor is affected.

Therefore, while the integration density of a semiconductor structure is increased, it is necessary to design a semiconductor device that can increase the capacitance and can improve size precision of a capacitor.

SUMMARY

Embodiments of the disclosure relate to a semiconductor structure and a method for manufacturing same.

Embodiments of the disclosure provide a semiconductor structure and a method for manufacturing same.

Embodiments of the disclosure provide a semiconductor structure, including a base and a storage unit located on the base. The storage unit includes: a first dielectric layer and a metal bit line located in the first dielectric layer, the first dielectric layer exposing a surface of the metal bit line; a semiconductor channel, located on a partial surface of the metal bit line, the semiconductor channel facing a bottom surface of the metal bit line and being electrically connected to the metal bit line; a word line, disposed surrounding a partial region of the semiconductor channel; a second dielectric layer, located between the metal bit line and the word line, and further located on a side of the word line away from the base; a first lower electrode layer and a second lower electrode layer, stacked on a top surface of the semiconductor channel away from the metal bit line, the first lower electrode layer contacting the top surface of the semiconductor channel; an upper electrode layer, located on a top surface of the second lower electrode layer, and surrounding the first lower electrode layer and the second lower electrode layer; and a capacitor dielectric layer, located between the upper electrode layer and the first lower electrode layer, and further located between the upper electrode layer and the second lower electrode layer.

Correspondingly, embodiments of the disclosure further provide a method for manufacturing a semiconductor structure, which includes the following operations. A base is provided. A storage unit is formed on the base, in which forming the storage unit includes the following operations. A first dielectric layer and a metal bit line located in the first dielectric layer are provided, and the first dielectric layer exposes a surface of the metal bit line. A semiconductor channel is formed, which is located on a partial surface of the metal bit line, and the semiconductor channel faces a bottom surface of the metal bit line and is electrically connected to the metal bit line. A word line is formed, which is disposed surrounding a partial region of the semiconductor channel. A second dielectric layer is formed, which is located between the metal bit line and the word line, and further located on a side of the word line away from the base. A first lower electrode layer which is in contact with a top surface of the semiconductor channel is formed. A second lower electrode layer which is located on a top surface of the first lower electrode layer is formed. An upper electrode layer which is located on a top surface of the second lower electrode layer is formed, and the upper electrode layer is formed surrounding the first lower electrode layer and the second lower electrode layer. A capacitor dielectric layer is formed, which is located between the upper electrode layer and the first lower electrode layer, and further located between the upper electrode layer and the second lower electrode layer.

BRIEF DESCRIPTION OF THE DRAWINGS

One or more embodiments are exemplarily described by using diagrams in the corresponding accompanying drawings. Unless specifically indicated, the diagrams in the accompanying drawings do not constitute any limitations on proportions.

DETAILED DESCRIPTION

Figure 1:
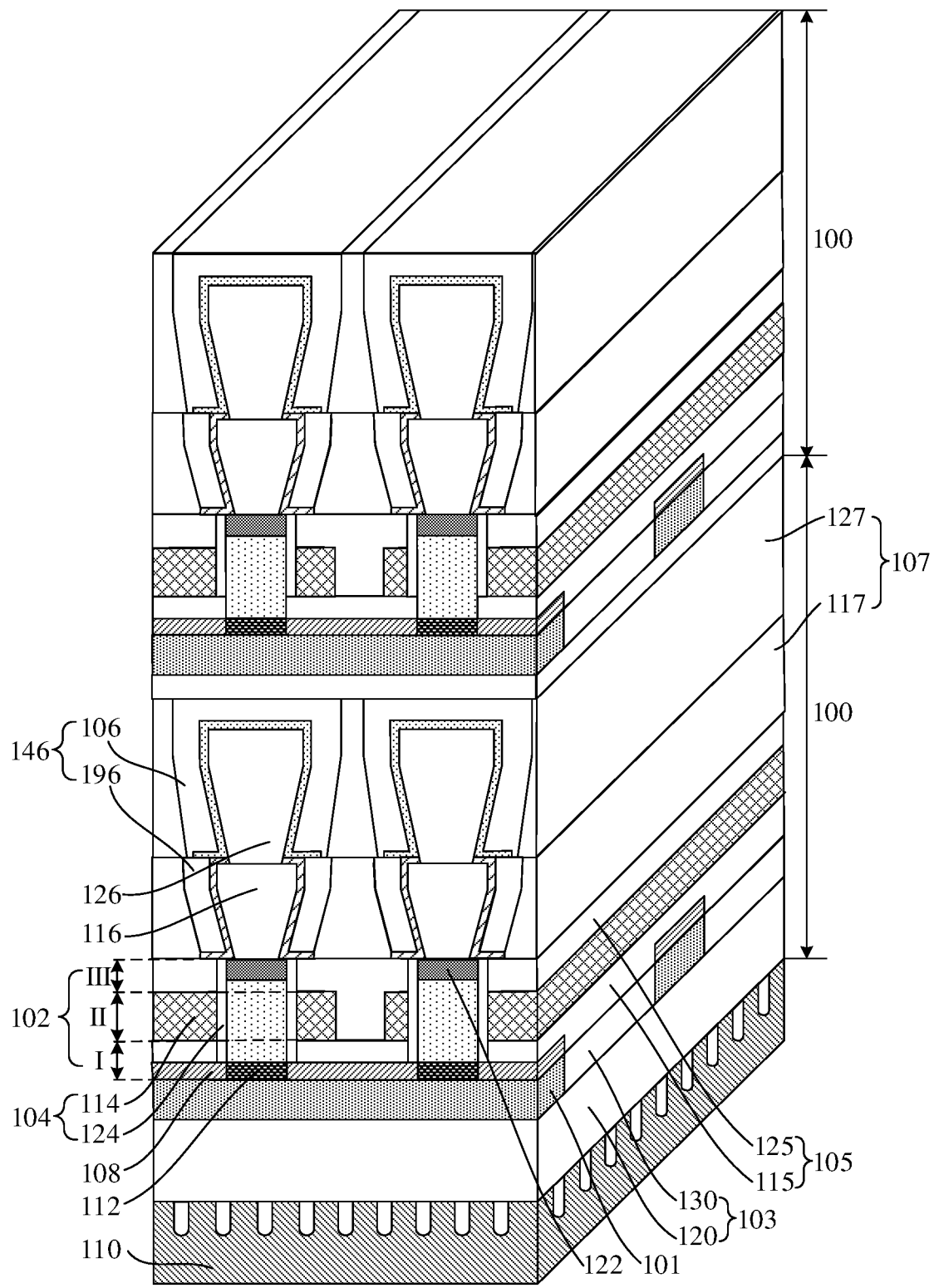
FIG. 1 is a schematic structural sectional view corresponding to a semiconductor structure according to an embodiment of the disclosure.

As can be seen from the background, in the prior art, while the integration density of a semiconductor device is increased, both the capacitance and size precision of a capacitor in a semiconductor structure need to be improved.

To resolve the foregoing problem, embodiments of the disclosure provide a semiconductor structure and a method for manufacturing same. In the semiconductor structure, a channel region of a semiconductor channel is vertically disposed on a surface of a metal bit line, so as to enable the semiconductor structure to include a vertical Gate-All-Around (GAA) transistor. It is conducive to saving the layout space of the semiconductor channel in a direction (usually a horizontal direction) parallel to the surface of the metal bit line, thereby increasing the integration density of the semiconductor structure in the horizontal direction. In addition, the structure of a lower electrode layer in a capacitor is changed. Specifically, a first lower electrode layer and a second lower electrode layer are stacked to form the lower electrode layer. This helps to increase the overall height of the lower electrode layer of the capacitor, so as to increase the aspect ratio of the capacitor, thereby increasing the opposing area between the upper electrode layer and the lower electrode layer in the capacitor, so that a capacitance of the capacitor is increased. In addition, the orthographic projection of the bottom surface of the second lower electrode layer onto a base is located in the orthographic projection of the top surface of the first lower electrode layer onto the base, to enable the second lower electrode layer to be aligned with the first lower electrode layer, that is, to ensure a full contact between the bottom surface of the second lower electrode layer and the top surface of the first lower electrode layer, thereby avoiding a misalignment between the bottom surface of the second lower electrode layer and the top surface of the first lower electrode layer, so that both the capacitance and the size precision of the capacitor are improved to increase the formation quality of the capacitor, thereby ensuring that the capacitor has adequate electrical performance. Further, a capacitor dielectric layer further covers the top surface of the first lower electrode layer exposed by the second lower electrode layer, so as to prevent the upper electrode layer from contacting the first lower electrode layer through the top surface of the first lower electrode layer exposed by the second lower electrode layer, thereby further ensuring an adequate electrical performance of the capacitor.

For clearer description of the objectives, technical solutions, and advantages of the embodiments of the disclosure, the embodiments of the disclosure are described in detail hereinafter with reference to the accompanying drawings. However, it is understandable to those of ordinary skill in the art that many technical details are provided for a reader to better understand the disclosure in the embodiments of the disclosure. However, even in the absence of these technical details and various changes and modifications based on the following embodiments, the technical solutions claimed in the disclosure may be implemented.

An embodiment of the disclosure provides a semiconductor structure. The semiconductor structure provided in the embodiment of the disclosure is described below in detail with reference to the accompanying drawings. FIG. 1 is a schematic structural sectional view corresponding to a semiconductor structure according to an embodiment of the disclosure. FIG. 2 to FIG. 6 are five types of schematic structural sectional views of structures jointly constituted by a first lower electrode layer, a second lower electrode layer and a capacitor dielectric layer in a semiconductor structure according to an embodiment of the disclosure.

Referring to FIG. 1 to FIG. 6, the semiconductor structure includes a base 110 and a storage unit 100 located on the base 110. The storage unit 100 includes: a first dielectric layer 103 and a metal bit line 101 located in the first dielectric layer 103, the first dielectric layer 103 exposing a surface of the metal bit line 101; a semiconductor channel 102, located on a partial surface of the metal bit line 101, the semiconductor channel 102 facing a bottom surface of the metal bit line 101 and being electrically connected to the metal bit line 101; a word line 104, disposed surrounding a partial region of the semiconductor channel 102; a second dielectric layer 105, located between the metal bit line 101 and the word line 104, and further located on a side of the word line 104 away from the base 110; a first lower electrode layer 116 and a second lower electrode layer 126, stacked on a top surface of the semiconductor channel 102 away from the metal bit line 101, the first lower electrode layer 116 contacting the top surface of the semiconductor channel 102; an upper electrode layer 146, located on a top surface of the second lower electrode layer 126, and surrounding the first lower electrode layer 116 and the second lower electrode layer 126; and a capacitor dielectric layer 136, located between the upper electrode layer 146 and the first lower electrode layer 116, and further located between the upper electrode layer 146 and the second lower electrode layer 126.

Specifically, the orthographic projection of the bottom surface of the second lower electrode layer 126 onto the base 110 is located in the orthographic projection of the top surface of the first lower electrode layer 116 onto the base 110. The capacitor dielectric layer 136 covers the top surface and sides of the second lower electrode layer 126, and further covers sides of the first lower electrode layer 116 and the top surface of the first lower electrode layer 116 exposed by the second lower electrode layer 126.

In a direction from the base 110 to the metal bit line 101, the semiconductor channel 102 includes a first doped region I, a channel region II and a second doped region III that are sequentially arranged. The first doped region I is electrically connected to the metal bit line 101. The word line 104 is disposed surrounding the channel region II. The first lower electrode layer 116 is in contact with the side of the second doped region III away from the channel region II.

Because the semiconductor structure includes a vertical GAA transistor and the metal bit line 101 is located between the base 110 and the GAA transistor, a 3-dimensional (3D) stacked storage device can be formed. This helps to improve the integration density of the semiconductor structure. In addition, the capacitor in the semiconductor structure is jointly formed by the first lower electrode layer 116, the second lower electrode layer 126, the capacitor dielectric layer 136 and the upper electrode layer 146. That is, the lower electrode layer of the capacitor is formed by stacking the first lower electrode layer 116 and the second lower electrode layer 126. On one hand, in a direction perpendicular to the surface of the base 110, for manufacturing the lower electrode layer with a relatively large height, the first lower electrode layer 116 and the second lower electrode layer 126 with relatively small heights may be formed in separate operations. Because the first lower electrode layer 116 and the second lower electrode layer 126 have relatively small heights, this helps to prevent the first lower electrode layer 116 and the second lower electrode layer 126 from tilting or collapsing, so that the overall stability of the lower electrode layer is improved, and the capacitor with a large aspect ratio and a large capacitance can be formed. On the other hand, the orthographic projection of the bottom surface of the second lower electrode layer 126 onto the base 110 is located in the orthographic projection of a top surface of the first lower electrode layer 116 onto the base 110, so as to enable the second lower electrode layer 126 to be aligned with the first lower electrode layer 116, that is, a misalignment between the bottom surface of the second lower electrode layer 126 and the top surface of the first lower electrode layer 116 is avoid, so that both the capacitance and the size precision of the capacitor are improved, so as to increase the formation quality of the capacitor, thereby ensuring that the capacitor has adequate electrical performance.

The semiconductor structure is described below in further detail with reference to FIG. 1.

In this embodiment, the base 110 may be a logical circuit structure layer, and is provided with a plurality of logical circuits.

The first dielectric layer 103 may include: an interlayer dielectric layer 120, which is located on the surface of the base 110, and the metal bit line 101 is located on a partial surface of the interlayer dielectric layer 120 away from the base 110; and an isolation layer 130, which is located on the surface of the interlayer dielectric layer 120 exposed by the metal bit line 101, and covering sidewalls of the metal bit line 101.

Specifically, the logical circuit structure layer may be a stack structure. A partial surface of the interlayer dielectric layer 120 away from the logical circuit structure layer may be provided with a plurality of metal bit lines 101 spaced away from each other. Each metal bit line 101 may be in contact with and electrically connected to at least one first doped region I. In FIG. 1, as an example, each metal bit line 101 is in contact with two first doped regions I. The number of the first doped regions I in contact with and electrically connected to each metal bit line 101 may be appropriately set according to an actual electrical requirement. The top surfaces of the metal bit lines 101 may be flush with the top surface of the isolation layer 130. This helps to provide adequate support for other structures located on the top surfaces of the metal bit lines 101 and the top surface of the isolation layer 130.

The interlayer dielectric layer 120 is used for implementing insulation between the logical circuit structure layer and the metal bit lines 101. The interlayer dielectric layer 120 helps to prevent electrical leakage between any two adjacent metal bit lines 101. The material of the interlayer dielectric layer 120 includes at least one of silicon oxide, silicon nitride, silicon carbon nitride or silicon carbon oxynitride.

The isolation layer 130 is located between two adjacent ones of the metal bit lines 101, and is used for achieving insulation between the adjacent metal bit lines 101. The material of the isolation layer 130 includes at least one of silicon oxide, silicon nitride, silicon carbon nitride or silicon carbon oxynitride.

In this embodiment, the interlayer dielectric layer 120 and the isolation layer 130 are an integral structure, thereby mitigating interface state defects between the interlayer dielectric layer 120 and the isolation layer 130, and improving the performance of the semiconductor structure. Moreover, the material of the interlayer dielectric layer 120 is the same as the material of the isolation layer 130, which helps to reduce processes in manufacturing the semiconductor structure and reduce the costs and complexity of manufacturing the semiconductor structure. In other embodiments, the interlayer dielectric layer and the isolation layer may be layered structures. The material of the interlayer dielectric layer may be different from the material of the isolation layer.

The material of the metal bit lines 101 is metal. The benefits of such an arrangement are as follows. On one hand, the metal bit line 101 of a metal material generally have a relatively small resistivity, which helps to reduce the resistance of the metal bit line 101, so that the transmission rate of electrical signals in the metal bit line 101 is increased, a parasitic capacitance of the metal bit line 101 is reduce, and a thermal loss is decreased to reduce power consumption. On the other hand, the semiconductor structure may further include a circuit structure which is provided with a metal conductive layer used for electrical connections, for example, so called M0 layer, M1 layer, M2 layer, or the like by a person skilled in the art. The processes for a metal conductive layer may be used to manufacture the metal bit lines 101 at the same time of forming the metal conductive layer. In this way, the steps of manufacturing the semiconductor structure can be reduced, and the costs of the semiconductor structure can be reduced.

The material of the metal bit lines 101 may be a metal, a metal compound or an alloy. The metal may be copper, aluminum, tungsten, gold, silver or the like. The metal compound may be tantalum nitride or titanium nitride. The alloy may be an alloy material formed by at least two of copper, aluminum, tungsten, gold or silver. In addition, the material of the metal bit lines 101 may also be at least one of nickel, cobalt or platinum.

In some embodiments, the material of the metal bit lines 101 is copper.

The semiconductor structure may include a plurality of metal bit lines 101 spaced apart from each other. Each metal bit line 101 extends in a first direction. Each metal bit line 101 may be electrically connected to at least two semiconductor channels 102.

The material of the semiconductor channels 102 at least includes one of Indium Gallium Zinc Oxide (IGZO), Indium Tungsten Oxide (IWO) or Indium Tin Oxide (ITO). When the semiconductor channels 102 are formed by the foregoing materials, this helps to increase the carrier mobility of the semiconductor channels 102, thereby facilitating more efficient transfer of an electrical signal in the semiconductor channels 102.

In an example, the material of the semiconductor channels 102 is IGZO. The carrier mobility of IGZO is 20 times to 50 times that of polycrystalline silicon, which helps to increase the carrier mobility of the channel regions II in the semiconductor channels 102, thereby helping to reduce a leakage current during the semiconductor structure operates, so as to reduce the power consumption of the semiconductor structure and increase the operating efficiency of the semiconductor structure. In addition, a retention time of a memory unit configured for a GAA transistor formed by IGZO semiconductor channels 102 may exceed 400 s. This helps to reduce the refresh rate and power consumption of a memory.

In this embodiment, each of the semiconductor channels 102 has a cylindrical structure, in which the side of the semiconductor channel 102 is a smooth transition surface, which helps to prevent a phenomenon of point discharge or electrical leakage from occurring at the semiconductor channel 102, thereby further improving the electrical performance of the semiconductor structure. It needs to be noted that, in other embodiments, a semiconductor channel may have an elliptical column structure, a parallelepiped column structure or other irregular structures. It may be understood that when the semiconductor channel structure is a parallelepiped column structure, the corners formed by adjacent surfaces of sidewalls of the parallelepiped column structure may be rounded corners, so that a point discharge problem can be avoided. The parallelepiped column structure may be a cube column structure or a rectangular parallelepiped column structure.

The first doped region I forms one of a source or a drain of a transistor device, and the second doped region III forms the other of the source or the drain of the transistor device. The first doped region I, the channel region II, and the second doped region III have the same semiconductor element. That is, the first doped region I, the channel region II, and the second doped region III are an integral structure. This helps to mitigate the interface state defects between the first doped region I and the channel region II and mitigate an interface state defect between the channel region II and the second doped region III, thereby improving the performance of the semiconductor structure. It may be understood that in other embodiments, the semiconductor channel may be a three-layer structure, and three layers are correspondingly used as the first doped region, the channel region, and a third doped region.

The first doped region I may include a first metal semiconductor layer 112. The first metal semiconductor layer 112 is in contact with the metal bit line 101, and a resistivity of the first metal semiconductor layer 112 is less than a resistivity of the first doped region I other than the first metal semiconductor layer 112. In this way, this helps to reduce the resistivity of the first doped region I, and the first metal semiconductor layer 112 and the first doped region I other than the first metal semiconductor layer 112 form an ohmic contact, so as to prevent the metal bit lines 101 from directly contacting a semiconductor material and thus avoid forming a Schottky barrier contact. The ohmic contact helps to reduce the contact resistance between the first doped region I and the metal bit line 101, so that energy consumption of the semiconductor structure during working is reduced, and an RC delay effect is mitigated, thereby improving the electrical performance of the semiconductor structure. It should be understood that, in other embodiments, the semiconductor material of the first doped region may be in direct contact with the metal bit line. That is, the first doped region does not include a first metal semiconductor layer.

Specifically, the metal element in the first metal semiconductor layer 112 includes at least one of cobalt, nickel or platinum. For example, the material of the semiconductor channel 102 is IGZO. Correspondingly, the material of the first metal semiconductor layer 112 may be nickel-containing IGZO, cobalt-containing IGZO, cobalt and nickel-containing IGZO, platinum-containing IGZO or the like. In addition, the first metal semiconductor layer 112 may be further doped with nitrogen.

The semiconductor element in the first metal semiconductor layer 112 is the same as the semiconductor element in the first doped region I other than the first metal semiconductor layer 112. That is, the first doped region I is an integral structure as a whole. Therefore, the first metal semiconductor layer 112 is a part of the first doped region I, which helps to mitigate an interface state defect between the first metal semiconductor layer 112 and the first doped region I other than the first metal semiconductor layer 112, thereby improving the performance of the semiconductor structure. It needs to be noted that, in other embodiments, the semiconductor element in the first metal semiconductor layer may be different from the semiconductor element in the first doped region other than the first metal semiconductor layer. For example, the semiconductor element in the first metal semiconductor layer may be silicon or germanium. Correspondingly, the first doped region I is a two-layer structure including a first metal semiconductor layer.

In some embodiments, the semiconductor channel 102 is in contact with the metal bit line 101. That is, the first doped region I is located on the surface of the metal bit line 101. Further, the semiconductor structure may further include a metal layer 108 which is located on the surface of the metal bit line 101 uncovered by the semiconductor channel 102. The metal layer 108 is formed by the metal element in the first metal semiconductor layer 112. It may be understood that the metal layer 108 is formed at the same time in step of forming the first metal semiconductor layer 112, and the material of the metal layer 108 may be at least one of cobalt, nickel or platinum.

In addition, in some other embodiments, the material of the metal bit line 101 is at least one of nickel, cobalt or platinum. Correspondingly, in the processes of manufacturing a semiconductor structure, a partial region of the metal bit line 101 in contact with the first doped region I reacts with the first doped region I to form the first metal semiconductor layer 112. In this way, the metal bit line 101 and the first metal semiconductor layer 112 are an integral structure, which helps to further reduce the contact resistance between the metal bit line 101 and the first metal semiconductor layer 112. That is, the metal bit line 101 may provide a metal element for the formation of the first metal semiconductor layer 112.

The second doped region III may include a second metal semiconductor layer 122 which is in contact with the first lower electrode layer 116, and the resistivity of the material of the second metal semiconductor layer 122 is less than the resistivity of the second doped region III other than the second metal semiconductor layer 122. In this way, this helps to reduce the resistivity of the second doped region III. An ohmic contact is formed between the second metal semiconductor layer 122 and a capacitor structure, which helps to reduce a contact resistance between the second doped region III and the capacitor structure, so that energy consumption of a semiconductor structure during working is reduced, thereby improving the electrical performance of the semiconductor structure.

The metal element in the second metal semiconductor layer 122 includes at least one of cobalt, nickel or platinum. In this embodiment, the metal element in the first metal semiconductor layer 112 may be the same as the metal element in the second metal semiconductor layer 122. In other embodiments, the metal element in the first metal semiconductor layer may be different from the metal element in the second metal semiconductor layer.

In addition, a semiconductor element in the second metal semiconductor layer 122 is the same as the semiconductor element in the second doped region III other than the second metal semiconductor layer 122. That is, the second doped region III is an integral structure as a whole. The second metal semiconductor layer 122 is a part of the second doped region III. This helps to mitigate interface state defects between the second metal semiconductor layer 122 and the second doped region III other than the second metal semiconductor layer 122, thereby improving the performance of the semiconductor structure. It needs to be noted that in other embodiments, the semiconductor element in the second metal semiconductor layer may be different from the semiconductor element in the second doped region other than the second metal semiconductor layer. For example, the semiconductor element in the second metal semiconductor layer may be silicon or germanium. Correspondingly, the second doped region I is a two-layer structure including a second metal semiconductor layer.

Taking the case where the semiconductor element is silicon as an example, the second metal semiconductor layer 122 includes at least one of cobalt silicide, nickel silicide or platinum silicide. In addition, the second metal semiconductor layer 122 may be further doped with nitrogen.

In an extending direction of the metal bit lines 101, when the semiconductor channel 102 is used for forming a channel of a junctionless transistor, the width of the semiconductor channel 102 is within a nanoscale range, which helps to form a nanoscale junctionless transistor channel. That is, the first doped region I, the channel region II and the second doped region III have the same type of doped ions. For example, the doped ions are all N-type ions or P-type ions. Further, the first doped region I, the channel region II and the second doped region III may have the same doped ions. "Junctionless" herein refers to that there is no PN junction. That is, there is no PN junction in a transistor formed by the semiconductor channel 102. The benefits of this are as follows. In one aspect, the first doped region I and the second doped region III do not need to be additionally doped, thereby avoiding the problem that it is difficult to control doping process of the first doped region I and the second doped region III. Specifically, as the transistor size further decreases, if the first doped region I and the second doped region III are additionally doped, it is more difficult to control the doping concentration. In another aspect, since the device is a junctionless transistor, it is unnecessary to manufacture a hyperabrupt PN junction within a nanoscale range, thereby avoiding use of the hyperabrupt source-drain concentration gradient doping process. Therefore, problems such as a threshold voltage drift, a leakage current increase and the like caused by an abrupt doping change can be avoided. This also helps to inhibit a short channel effect, and the device can still operate within a scale of several nanometers. It is benefit to improve the integration density and electrical performance of the semiconductor structure. It should be understood that said additional doping herein refers to performing doping such that it is possible to dope a type of doped ions in the first doped region I and the second doped region III different from the type of doped ions in the channel region.

Further, a concentration of the doped ions in the first doped region I and a concentration of doped ions in the second doped region III may both be greater than a doping concentration of the doped ions in the channel region II. The doped ions are N-type ions or P-type ions. Specifically, the N-type ions are at least one type of ions of arsenic ions, phosphorus ions, or antimony ions. The P-type ions are at least one type of ions of boron ions, indium ions, or gallium ions.

The word line 104 includes a gate dielectric layer 114 which may surround an entire sidewall surface of the semiconductor channel 102. In this way, this helps to prevent electrical leakage in the semiconductor channel 102, thereby improving the electrical performance of a GAA transistor.

In other embodiments, the gate dielectric layer may only cover the part of sidewall surface of the semiconductor channel of the channel region, or the gate dielectric layer covers the part of sidewall surface of semiconductor channels of the channel region and the first doped region, or the gate dielectric layer covers the part of sidewall surface of semiconductor channel of the channel region and the second doped region, in which the gate dielectric layer is disposed surrounding the second doped regions. That is, when being located on the part of sidewall surface of the semiconductor channel of the second doped region, the gate dielectric layer can protect the surface of the second doped region, so as to avoid process damage to the surface of the second doped region in a manufacturing process. This helps to further improve the electrical performance of the semiconductor structure.

The word line 104 further includes a gate conductive layer 124. The gate conductive layer 124 is disposed surrounding a partial region of the semiconductor channel 102. The gate dielectric layer 114 is located between the semiconductor channel 102 and the gate conductive layer 124.

Specifically, the gate conductive layer 124 is disposed surrounding the channel region II, and is located on the sidewall surface of the gate dielectric layer 114 corresponding to the channel region II.

The material of the gate dielectric layer 114 includes at least one of silicon oxide, silicon nitride or silicon oxynitride. The material of the gate conductive layer 124 includes at least one of polycrystalline silicon, titanium nitride, tantalum nitride, copper, tungsten or aluminum.

In this embodiment, the semiconductor structure may include a plurality of word lines 104 arranged at intervals. Each word line 104 extends in a second direction. The second direction is different from the first direction. For example, the first direction may be perpendicular to the second direction. In addition, for each word line 104, each word line 104 may be disposed surrounding the channel region II of at least one semiconductor channel 102. In FIG. 1, as an example, each word line 104 surrounds two semiconductor channels 102. The number of the semiconductor channels 102 surrounded by each word line 104 can be appropriately set according to an actual electrical requirement.

The second dielectric layer 105 is used for isolating the metal layers 108 from the word lines 104, for isolating the metal bit lines 101 from the word lines 104, and further for isolating adjacent word lines 104 and adjacent metal layers 108. That is, the second dielectric layer 105 is located between the metal layers 108 and the word lines 104, and is further located in the intervals between adjacent word lines 104 and the intervals between adjacent metal layers 108.

The second dielectric layer 105 may include a third dielectric layer 115 and a fourth dielectric layer 125. The third dielectric layer 115 is located between the metal layers 108 and the word lines 104 and in the intervals between adjacent metal layers 108, so as to achieve insulation between the metal layers 108 and the word lines 104, thereby preventing electrical interference between the metal layers 108 and the word lines 104, and further preventing electrical interference between the metal bit lines 101 and the word lines 104. The fourth dielectric layer 125 is located between adjacent word lines 104 and in contact with the third dielectric layer 115, which is used for achieving insulation between adjacent word lines 104, thereby preventing electrical interference between the adjacent word lines 104. The fourth dielectric layer 125 is further located on surfaces of the word lines 104 away from the base 110 and is used for supporting other conductive structures located on a surface of the fourth dielectric layer 125 away from the base 110, so as to achieve insulation between the word lines 104 and other conductive structures.

A top surface of the fourth dielectric layer 125 may be flush with top surfaces of the second doped regions III. This helps to provide adequate support for other structures located on the top surface of the fourth dielectric layer 125 and the top surfaces of the second doped regions III.

In this embodiment, the material of the third dielectric layer 115 and the material of the fourth dielectric layer 125 are the same, and may both be at least one of silicon oxide, silicon nitride, silicon carbon oxynitride or silicon oxynitride. In other embodiments, the material of the third dielectric layer and the material of the fourth dielectric layer may be different.

It may be understood that in other embodiments, the second dielectric layer may be other stack film layer structures. A specific structure of the stack film layer structure is related to processes of the manufacturing process, as long as it is ensured that the second dielectric layer can implement isolation.

The capacitor includes a first lower electrode layer 116, a second lower electrode layer 126, a capacitor dielectric layer 136 and an upper electrode layer 146. The capacitor is described below in detail with reference to FIG. 1 to FIG. 6.

In this embodiment, the first lower electrode layer 116 and the second lower electrode layer 126 constitute a lower electrode layer of the capacitor. Each word line 104 extends in the second direction. In FIG. 1, as an example, each word line 104 surrounds two semiconductor channels 102, and the first lower electrode layer 116 and the second lower electrode layer 126 also extend in the second direction. Specifically, each lower electrode layer corresponds to one word line 104. That is, each lower electrode layer is in contact with the side away from the channel region II of the second doped region III surrounded by the word line 104 corresponding to the lower electrode layer. In FIG. 1, as an example, the lower electrode layers are respectively in contact with the top surfaces of the second doped regions III of the two semiconductor channels 102.

In some examples, in a direction perpendicular to the surface of the base 110, the thickness of the first lower electrode layers 116 may be greater than the thickness of the second lower electrode layers 126. In some other examples, in the direction perpendicular to the surface of the base 110, the thickness of the first lower electrode layers 116 may be less than or equal to the thickness of the second lower electrode layers 126. In addition, the material of the first lower electrode layers 116 may be the same as the material of the second lower electrode layers 126. In addition, because the first lower electrode layers 116 and the second lower electrode layers 126 are manufactured by separate steps, the material of the first lower electrode layers 116 may be different from the material of the second lower electrode layers 126.

In addition, the upper electrode layers 146 also extend in the second direction. The upper electrode layers 146 one-to-one correspond to the lower electrode layers. The orthographic projection of each upper electrode layer 146 onto the base 110 covers the orthographic projection of each lower electrode layer onto the base 110. The orthographic projection of each lower electrode layer onto the base 110 is located in the orthographic projection of each word line 104 onto the base 110.

In other embodiments, each lower electrode layer may be in contact with the side away from the channel regions of only one second doped region, and each upper electrode layer may one-to-one correspond to each lower electrode layer or one upper electrode layer corresponds to a plurality of lower electrode layers. Or, one lower electrode layer may be in contact with the sides away from the channel regions of a plurality of second doped regions, and each upper electrode layer may correspond to only one semiconductor channel. That is, one lower electrode layer corresponds to a plurality of upper electrode layers. In these ways, in adjacent capacitors, upper electrode layers may be connected to different electric potentials or lower electrode layers may be connected to different electric potentials. This helps to implement diversified control of the adjacent capacitors.

The lower electrode layer is formed by stacking a first lower electrode layer 116 and a second lower electrode layer 126, which helps to increase the overall height of the lower electrode layer. Thus, while increasing the capacitance of a capacitor, the first lower electrode layer 116 and the second lower electrode layer 126 with relatively small heights may be formed by separate steps, so as to prevent the first lower electrode layer 116 and the second lower electrode layer 126 from tilting or collapsing, so that the overall stability of the lower electrode layer is improved. The orthographic projection of the bottom surface of the second lower electrode layer 126 onto the base 110 is located in the orthographic projection of the top surface of the first lower electrode layer 116 onto the base 110, so as to ensure a full contact between the bottom surface of the second lower electrode layer 126 and the top surface of the first lower electrode layer 116, thereby avoiding a misalignment between the bottom surface of the second lower electrode layer 126 and the top surface of the first lower electrode layer 116, so that the size precision of the capacitor is improved.

In some examples, in the extending direction of the metal bit line 101, a width of the bottom surface of the first lower electrode layer 116 is less than a maximum width of the semiconductor channel 102. In other embodiments, the width of the bottom surface of the first lower electrode layer may be greater than or equal to the maximum width of the semiconductor channel.

Referring to FIG. 1 to FIG. 4, a first lower electrode layer 116 includes a first lower conductive column 113 and a first lower conductive block 123. The first lower conductive column 113 is in contact with a second doped region III. One end of the first lower conductive block 123 is in contact with the first lower conductive column 113, and the other end is in contact with a second lower electrode layer 126. The second lower electrode layer 126 includes a second lower conductive column 133 and a second lower conductive block 143. The second lower conductive column 133 is in contact with the first lower conductive block 123. One end of the second lower conductive block 143 is in contact with the second lower conductive column 133, and the other end is in contact with a capacitor dielectric layer 136. In some examples, the first lower conductive column 113 covers the entire top surface of the second doped region III. In addition, in the direction away from the base 110, a cross-sectional area of the first lower conductive column 113 in a direction parallel to the surface of the base 110 is gradually increased, and the orthographic projection of the top surface of the first lower conductive column 113 onto the base 110 coincides with the orthographic projection of the bottom surface of the first lower conductive block 123 onto the base 110, so that the largest contact area is ensured between the second doped region III and the first lower electrode layer 116, and the volume of the first lower electrode layer 116 is increased, so as to reduce the resistance of the first lower electrode layer 116, thereby contributing to reduce a contact resistance between the second doped region III and the first lower electrode layer 116.

In the direction away from the base 110, the cross-sectional area of the second lower conductive column 133 in the direction parallel to the surface of the base 110 is gradually increased, and the orthographic projection of the bottom surface of the second lower conductive column 133 onto the base 110 is located in the orthographic projection of the bottom surface of the first lower conductive block 123 onto the base 110, so that a misalignment between the bottom surface of the second lower electrode layer 126 and the top surface of the first lower electrode layer 116 is avoided, and the volume of the second lower electrode layer 126 is increased, so as to reduce the resistance of the second lower electrode layer 126, thereby contributing to reduce the contact resistance between the second lower electrode layer 126 and the first lower electrode layer 116. In addition, the orthographic projection of the top surface of the second lower conductive column 133 onto the base 110 coincides with the orthographic projection of the bottom surface of the second lower conductive block 143 onto the base 110.

In other embodiments, the orthographic projection of the top surface of the first lower conductive column onto the base may cover the orthographic projection of the bottom surface of the first lower conductive block onto the base, and the orthographic projection of the top surface of the second lower conductive column onto the base may cover the orthographic projection of the bottom surface of the second lower conductive block onto the base.

In this embodiment, the first lower conductive column 113 and the first lower conductive block 123 are an integral structure, and the second lower conductive column 133 and the second lower conductive block 143 are an integral structure, so as to mitigate interface state defects between the first lower conductive column 113 and the first lower conductive block 123 and interface state defects the second lower conductive column 133 and the second lower conductive block 143, thereby improving the performance of the semiconductor structure. The first lower conductive column 113, the first lower conductive block 123, the second lower conductive column 133 and the second lower conductive block 143 may have the same material. In this way, this helps to reduce the process steps of manufacturing a semiconductor structure and reduce the costs and complexity of manufacturing the semiconductor structure. The materials of the first lower conductive column 113, the first lower conductive block 123, the second lower conductive column 133 and the second lower conductive block 143 may respectively be at least one of nickel-platinum, titanium, tantalum, cobalt, polycrystalline silicon, copper, tungsten, tantalum nitride, titanium nitride or ruthenium.

In other embodiments, the first lower conductive column and the first lower conductive block may be not an integral structure, and the second lower conductive column and the second lower conductive block may be not an integral structure. That is, the materials of the first lower conductive column, the first lower conductive block, the second lower conductive column and the second lower conductive block may be different.

Figure 5:
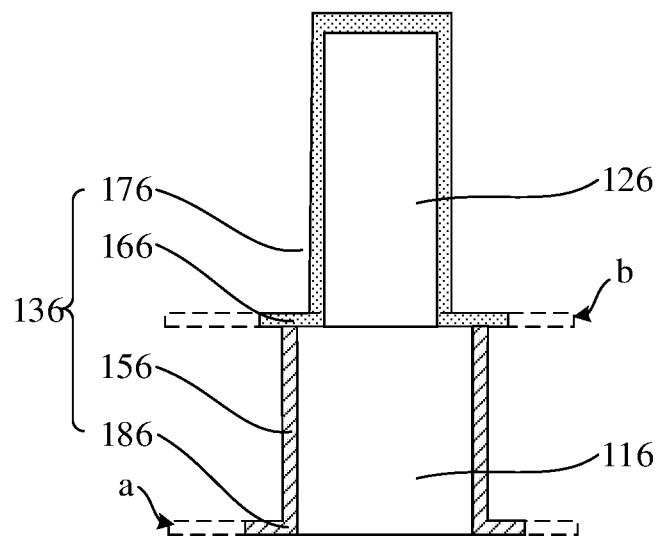
Figure 6:
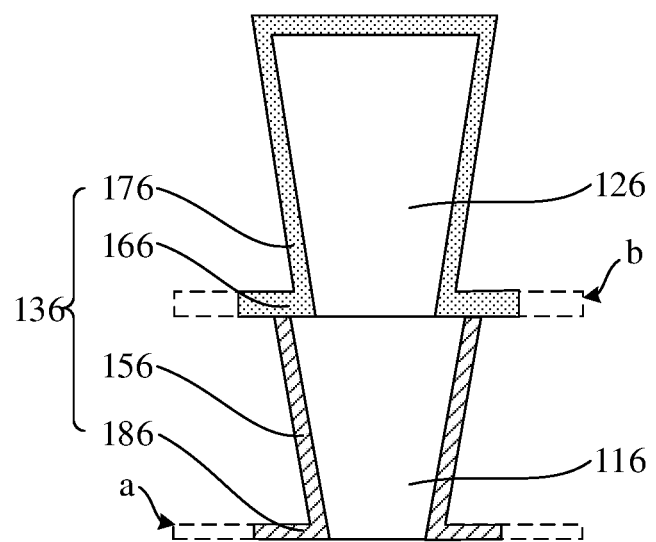

In other embodiments, referring to FIG. 5, a cross-sectional shape of the first lower electrode layer 116 and a cross-sectional shape of the second lower electrode layer 126 may both be a rectangle. Referring to FIG. 6, the cross-sectional shape of the first lower electrode layer 116 and the cross-sectional shape of the second lower electrode layer 126 may both be an inverted-trapezoid.

Referring to FIG. 2 to FIG. 6, a capacitor dielectric layer 136 includes a first capacitor dielectric layer 156, a second capacitor dielectric layer 166 and a third capacitor dielectric layer 176. The first capacitor dielectric layer 156 covers sides of the first lower electrode layer 116. The second capacitor dielectric layer 166 covers a top surface of the first lower electrode layer 116 exposed by the second lower electrode layer 126. The third capacitor dielectric layer 176 covers the top surface and sides of the second lower electrode layer 126.

The first capacitor dielectric layer 156, the second capacitor dielectric layer 166 and the third capacitor dielectric layer 176 jointly cover surfaces of the first lower electrode layer 116 and the second lower electrode layer 126, so as to isolate the upper electrode layer 146 from the first lower electrode layer 116 and the second lower electrode layer 126. In addition, the second capacitor dielectric layer 166 covers the top surface of the first lower electrode layer 116 exposed by the second lower electrode layer 126, so as to prevent the upper electrode layer 146 from contacting the first lower electrode layer 116 through the top surface of the first lower electrode layer 116 exposed by the second lower electrode layer 126, thereby further ensuring that the capacitor has adequate electrical performance.

Further, the capacitor dielectric layer 136 may further include a fourth capacitor dielectric layer 186. The fourth capacitor dielectric layer 186 is connected to a bottom surface of the first capacitor dielectric layer 156, and extends in a direction away from an axis of the first lower electrode layer 116 perpendicular to the surface of the base 110. The upper electrode layer 146 (referring to FIG. 1) is further located on a surface of the fourth capacitor dielectric layer 186. In some examples, in the extending direction of the metal bit line 101, when the width of the bottom surface of the first lower electrode layer 116 is less than the maximum width of the semiconductor channel 102, the first lower electrode layer 116 exposes a part of the top surface of the second doped region III. The fourth capacitor dielectric layer 186 is connected to the bottom surface of the first capacitor dielectric layer 156, and extends in the direction away from the axis of the first lower electrode layer 116 perpendicular to the surface of the base 110. In this way, it is benefit to implement isolation between the upper electrode layer 146 and the second doped region III through the fourth capacitor dielectric layer 186, thereby ensuring adequate electrical performance of a semiconductor structure.

In this embodiment, the fourth capacitor dielectric layer 186 and the first capacitor dielectric layer 156 are an integrally formed structure, which helps to mitigate interface state defects between the fourth capacitor dielectric layer 186 and the first capacitor dielectric layer 156, thereby improving the overall isolation effect of the fourth capacitor dielectric layer 186 and the first capacitor dielectric layer 156. The material of the fourth capacitor dielectric layer 186 is the same as the material of the first capacitor dielectric layer 156. In this way, it is benefit to reduce the process of manufacturing a semiconductor structure and reduce the costs and complexity of manufacturing the semiconductor structure. In other embodiments, the fourth capacitor dielectric layer and the first capacitor dielectric layer may be layered structures. The material of the fourth capacitor dielectric layer may be different from the material of the first capacitor dielectric layer.

Figure 2:
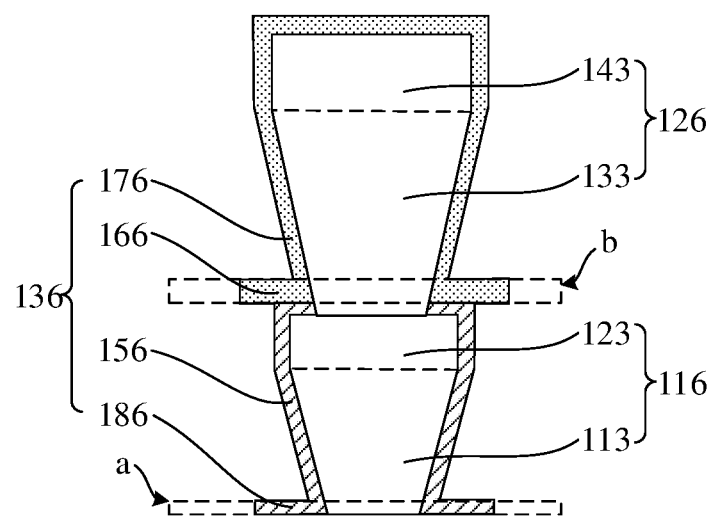
FIG. 2 to FIG. 6 are five types of schematic structural sectional views of structures jointly constituted by a first lower electrode layer, a second lower electrode layer and a capacitor dielectric layer in a semiconductor structure according to an embodiment of the disclosure.

In some embodiments, referring to FIG. 2, the top surface of the first lower electrode layer 116 exposed by the second lower electrode layer 126 is provided with the first capacitor dielectric layer 156. The second capacitor dielectric layer 166 is located on the top surface of the first capacitor dielectric layer 156, so as to cover the top surface of the first lower electrode layer 116 exposed by the second lower electrode layer 126. In addition, the second capacitor dielectric layer 166 further extends in an direction away from the axial of the second lower electrode layer 126 perpendicular to the surface of the base 110, thereby further improving the isolation effect between the upper electrode layer 146 and the top surface of the first lower electrode layer 116.

Figure 3:
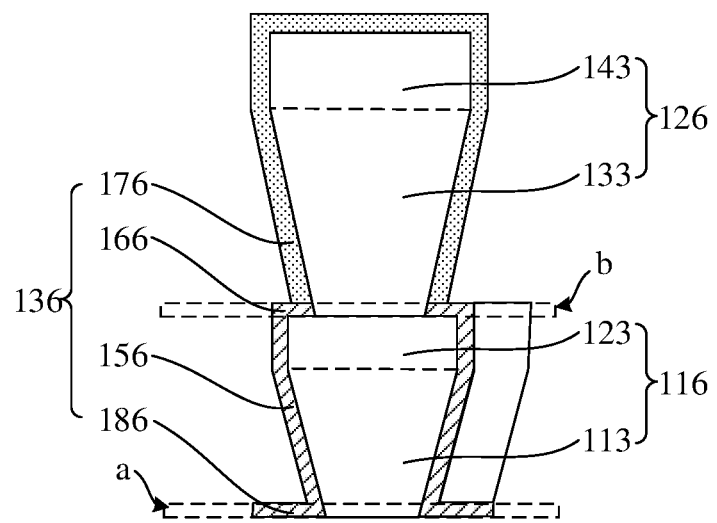

In some other embodiments, referring to FIG. 3, the second capacitor dielectric layer 166 is in contact with the top surface of the first lower electrode layer 116 exposed by the second lower electrode layer 126, and extends in a direction away from the axial of the second lower electrode layer 126 perpendicular to the surface of the base 110, thereby implementing the isolation between the upper electrode layer 146 and the top surface of the first lower electrode layer 116.

The second capacitor dielectric layer 166 and the third capacitor dielectric layer 176 may be an integrally formed structure, which helps to mitigate interface state defects between the second capacitor dielectric layer 166 and the third capacitor dielectric layer 176, thereby improving the overall isolation effect of the second capacitor dielectric layer 166 and the third capacitor dielectric layer 176. The material of the second capacitor dielectric layer 166 is the same as the material of the third capacitor dielectric layer 176. In this way, it is benefit to reduce the process steps of manufacturing a semiconductor structure and reduce the costs and complexity of manufacturing the semiconductor structure. In other embodiments, the second capacitor dielectric layer and the third capacitor dielectric layer may be a layered structure. The material of the second capacitor dielectric layer may be different from the material of the third capacitor dielectric layer.

Figure 4:
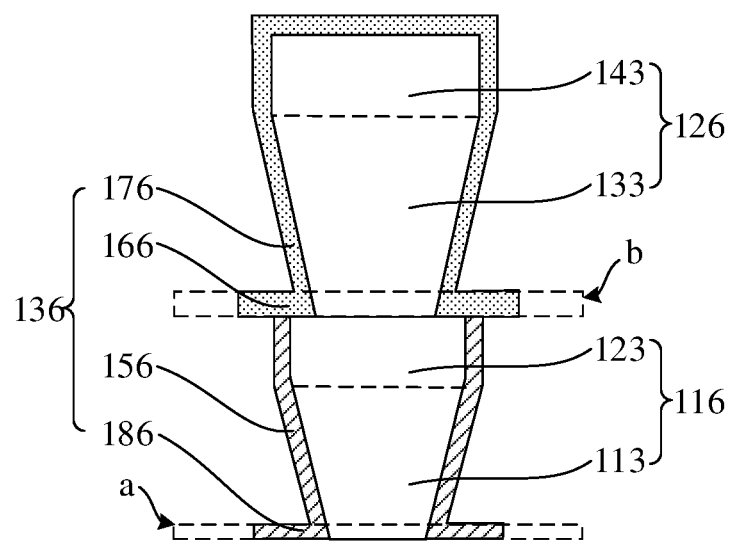

In still some other examples, referring to FIG. 4 to FIG. 6, the top surface of the first lower electrode layer 116 exposed by the second lower electrode layer 126 is provided with the first capacitor dielectric layer 156. The first capacitor dielectric layer 156 and the second capacitor dielectric layer 166 are an integrally formed structure, which helps to mitigate interface state defects between the first capacitor dielectric layer 156 and the second capacitor dielectric layer 166, thereby improving the overall isolation effect of the first capacitor dielectric layer 156 and the second capacitor dielectric layer 166. The material of the first capacitor dielectric layer 156 is the same as the material of the second capacitor dielectric layer 166. In this way, it is benefit to reduce the process steps of manufacturing a semiconductor structure and reduce the costs and complexity of manufacturing the semiconductor structure. In other embodiments, the first capacitor dielectric layer and the second capacitor dielectric layer may be a layered structure, the material of the first capacitor dielectric layer may be different from the material of the second capacitor dielectric layer.

It needs to be noted that in FIG. 2 to FIG. 6, the structure other than the first lower electrode layer 116 in the dashed box a is the fourth capacitor dielectric layer 186, the structure other than the second lower electrode layer 126 in the dashed box b is the second capacitor dielectric layer 166.

In this embodiment, the relative dielectric constant of the material of the capacitor dielectric layer 136 is greater than the relative dielectric constant of the material of the second dielectric layer 105, which helps to further improve the isolation effect between the first lower electrode layer 116 and the second lower electrode layer 126 and the upper electrode layer 146, thereby improving the electrical performance of a capacitor in the semiconductor structure.

The materials of the first capacitor dielectric layer 156, the second capacitor dielectric layer 166, the third capacitor dielectric layer 176 and the fourth capacitor dielectric layer 186 respectively include a high dielectric constant material such as silicon oxide, tantalum oxide, hafnium oxide, zirconium oxide, niobium oxide, titanium oxide, barium oxide, strontium oxide, yttrium oxide, lanthanum oxide, praseodymium oxide or barium strontium titanate.

It needs to be noted that, in FIG. 2 to FIG. 6, as examples, the second capacitor dielectric layers 166 of adjacent capacitors are separated from each other. In fact, the second capacitor dielectric layers 166 of adjacent capacitors may be in contact with and connected to each other. As examples, the fourth capacitor dielectric layers 186 of adjacent capacitors are separated from each other. In fact, the fourth capacitor dielectric layers 186 of adjacent capacitors may be in contact with and connected to each other.

Continuing to refer to FIG. 1, each upper electrode layer 146 includes a first upper electrode layer 196 and a second upper electrode layer 106. The first upper electrode layer 196 surrounding the first lower electrode layer 116 is located on the side of the first capacitor dielectric layer 156. The second upper electrode layer 106 surrounding the second lower electrode layer 126 is located on the surface of the third capacitor dielectric layer 176, and the bottom surface of the second upper electrode layer 106 is in contact with the top surface of the first upper electrode layer 196.

The materials of the first upper electrode layer 196 and the second upper electrode layer 106 may respectively be at least one of nickel-platinum, titanium, tantalum, cobalt, polycrystalline silicon, copper, tungsten, tantalum nitride, titanium nitride or ruthenium. In other embodiments, the material of the first upper electrode layer may be different from the material of the second upper electrode layer.

In this embodiment, the material of the whole lower electrode layer may be the same as the material of the whole upper electrode layer 146. In other embodiments, the material of the lower electrode layer may be different from the material of the upper electrode layer.

In some embodiments, the semiconductor structure may include two storage units 100 stacked on the base 110. In FIG. 1, as an example, the two storage units 100 are stacked on the base 110. A quantity of the storage units 100 stacked on the base 110 may be appropriately set according to an actual electrical requirement. Because a plurality of storage units 100 may be stacked on one same base 110, an array density of the semiconductor structure can be increased by increasing a size of the semiconductor structure in a thickness direction, thereby improving the storage performance of the semiconductor structure and reducing a planar size of the semiconductor structure, to implement a 3D stack. It can be understood that the array density refers to the density of the storage units 100 located in the semiconductor structure.

Further, the semiconductor structure further includes an insulating layer 107. The insulating layer 107 is located on the surface of the second dielectric layer 105. A capacitor formed by the first lower electrode layer 116, the second lower electrode layer 126, the capacitor dielectric layer 136 and the upper electrode layer 146 is located in the insulating layer 107. The insulating layer 107 is used for supporting the capacitor, to prevent the capacitor from collapsing, and is further used for isolating upper electrode layers 146 of adjacent capacitors.

In this embodiment, the insulating layer 107 is a stack film layer structure, and includes a first insulating layer 117 and a second insulating layer 127. The first insulating layer 117 is located between adjacent first upper electrode layers 196, and is used for achieving electrical insulation between the adjacent first upper electrode layers 196. The second insulating layer 127 is located between adjacent second upper electrode layers 106, and covers an upper surface of the first insulating layer 117, which is used for achieving electrical insulation between the adjacent second upper electrode layers 106.

The material of the first insulating layer 117 and the material of the second insulating layer 127 are the same, and may both be at least one of silicon nitride, silicon oxynitride, silicon carbon oxynitride or silicon oxide. In other embodiments, the material of the first insulating layer may be different from the material of the second insulating layer.

In summary, the channel region II of the semiconductor channel 102 is vertically disposed on the metal bit line 101, so as to provide the semiconductor structure with a GAA transistor, so that a memory device with a 3D stack can be formed. This helps to increase the integration density in the semiconductor structure. Meanwhile, the lower electrode layer of a capacitor in the semiconductor structure is formed by stacking the first lower electrode layer 116 and the second lower electrode layer 126. This helps to increase the overall height of the lower electrode layer of the capacitor, so that the capacitance of the capacitor is increased. In addition, the orthographic projection of the bottom surface of the second lower electrode layer 126 onto the base 110 is located in the orthographic projection of the top surface of the first lower electrode layer 116 onto the base 110, so as to enable the second lower electrode layer 126 to be aligned with the first lower electrode layer 116, to avoid a misalignment between the bottom surface of the second lower electrode layer 126 and the top surface of the first lower electrode layer 116, so that the capacitance is increased, and the size precision of the capacitor is improved, thus the formation quality of the capacitor is increased, thereby ensuring that the capacitor has adequate electrical performance.

In addition, the semiconductor structure provided in this embodiment may be applied to a $4F^2$ memory, in which F is a feature size. The memory may be a RRAM (Static Random Access Memory), a MRAM (Magnetoresistive Random Access Memory) or a PCRAM (Phase Change Random Access Memory), a DRAM (Dynamic Random Access Memory) or a SRAM (SRAM, Static Random Access Memory), and the memory may also be applied to In Memory Computing (IMC), that is, a user is allowed to store data in the memory and treating information at a faster speed. In a specific embodiment, the memory may be a DRAM, so that the metal bit lines 101 mentioned in the foregoing embodiments are bit lines of a DRAM, the word lines 104 are word lines of the DRAM, and the capacitor structures are storage capacitors of the DRAM.

Correspondingly, another embodiment of the disclosure provides a method for manufacturing a semiconductor structure, which may be used for forming the foregoing semiconductor structure.

FIG. 7 to FIG. 22 are schematic structural diagrams corresponding to operations in a method for manufacturing a semiconductor structure according to another embodiment of the disclosure. The method for manufacturing a semiconductor structure provided in this embodiment is described below in detail with reference to the accompanying drawings. Parts that are the same as or correspond to the foregoing embodiments are not described below in detail again.

Referring to FIG. 7 to FIG. 22, a base 110 is provided, and a storage unit 100 is formed thereon. Specifically, forming a storage unit 100 includes the following operations.

Figure 7:
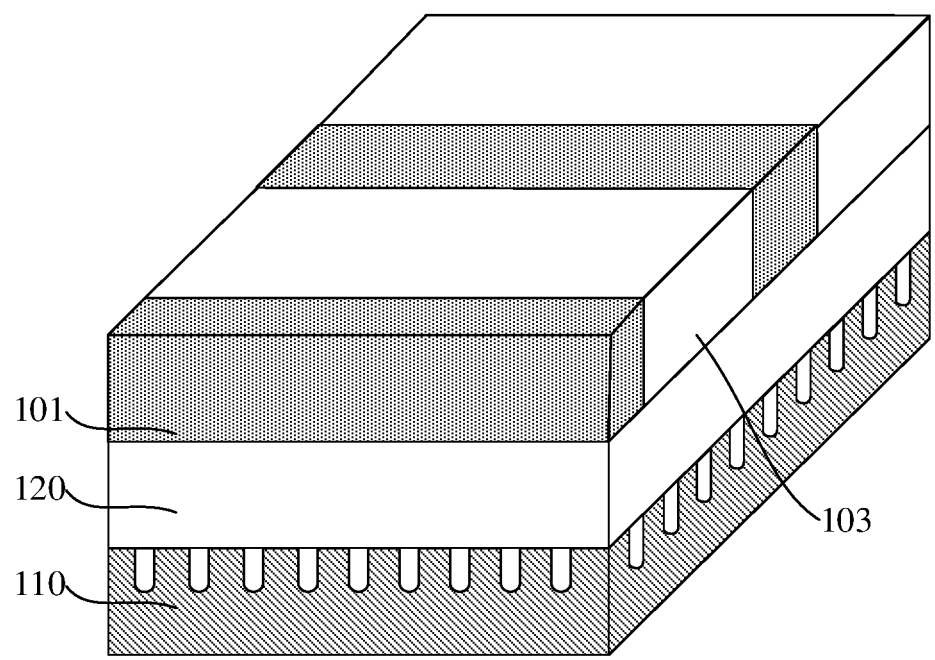
FIG. 7 to FIG. 22 are schematic structural sectional views corresponding to operations in a method for manufacturing a semiconductor structure according to another embodiment of the disclosure.

Referring to FIG. 7, the base 110 may be a logical circuit structure layer. A first dielectric layer 103 and metal bit lines 101 located therein are provided, and the first dielectric layer 103 exposes surfaces of the metal bit lines 101.

Specifically, an interlayer dielectric layer 120 that completely covers the surface of the logical circuit structure layer is formed, which is used for protecting the logical circuit structure layer, to prevent electrical interference between the logical circuit structure layer and the metal bit lines 101 that are subsequently formed on the interlayer dielectric layer 120.

A plurality of metal bit lines 101 discrete from each other are formed on a surface of the interlayer dielectric layer 120. The metal bit lines 101 expose a partial surface of the interlayer dielectric layer 120. An isolation layer 130 is formed. The isolation layer 130 is located on the surface of the interlayer dielectric layer 120 exposed by the metal bit line 101, and covers sidewalls of the metal bit lines 101.

For the material of the metal bit lines 101, reference may be made to corresponding description in the foregoing embodiments. Details are not described again herein.

It may be understood that in other embodiments, the surface of the logical circuit structure layer may also be provided with an initial dielectric layer. The initial dielectric layer is patterned to form a plurality of grooves that are discrete from each other in the initial dielectric layer. The initial dielectric layer located below the grooves is used as the interlayer dielectric layer. The initial dielectric layer located between adjacent grooves is used as the isolation layer. In this way, the isolation layer and the initial dielectric layer are an integral structure. Then, the metal bit lines filling the grooves are formed.

Figure 8:
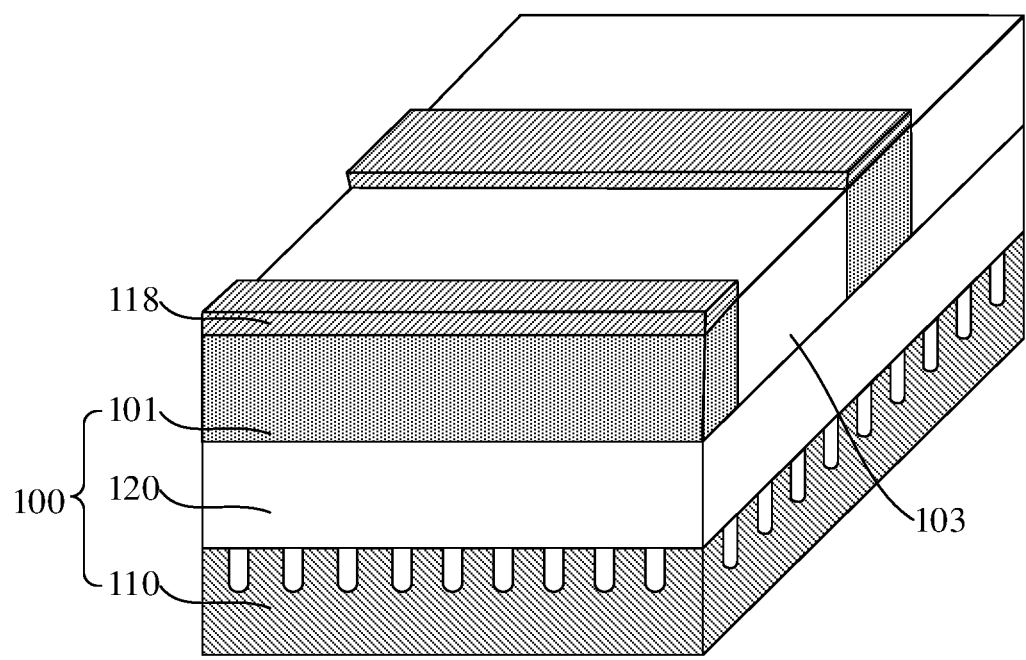

Referring to FIG. 8, a first metal layer 118 is formed on the surface of each metal bit line 101.

The first metal layer 118 is used for reacting with a region of a subsequently formed semiconductor channel close to the metal bit line 101, to provide a metal element for subsequent formation of a first metal semiconductor layer, thereby reducing the resistivity of the semiconductor channel. The material of the first metal layer 118 includes at least one of cobalt, nickel or platinum.

In this embodiment, the first metal layer 118 covers the entire surface of the metal bit line 101, which can prevent a process of etching the first metal layer 118 from causing etching damage to the metal bit line 101. In other embodiments, the first metal layer may be located on only a partial surface of each metal bit line, and a position of the first metal layer corresponds to the position where a semiconductor channel will be subsequently formed.

In other embodiments, a first metal layer may not be formed on the surface of each metal bit line, and subsequently a semiconductor channel is directly formed on the partial surface of the metal bit line. In addition, in some embodiments, the material of the metal bit line is at least one of nickel, cobalt or platinum. That is, the metal bit line may provide metal element for subsequent formation of the first metal semiconductor layer, thus it is not necessary to form a first metal layer on the surface of the metal bit line.

Figure 9:
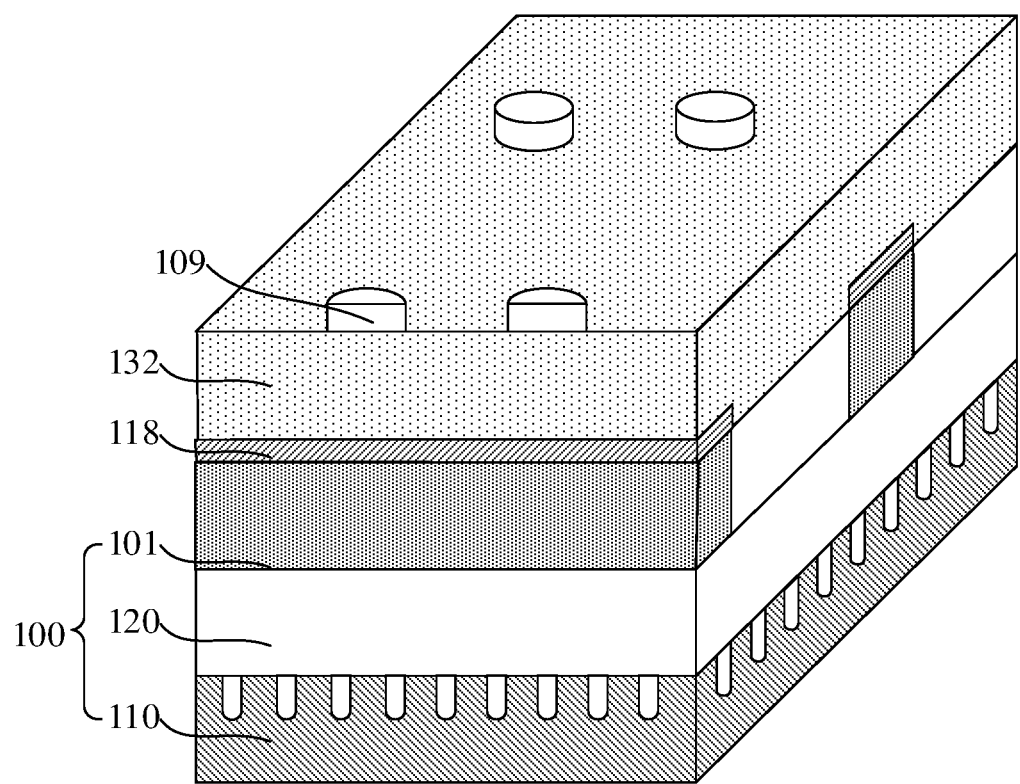
Figure 10:
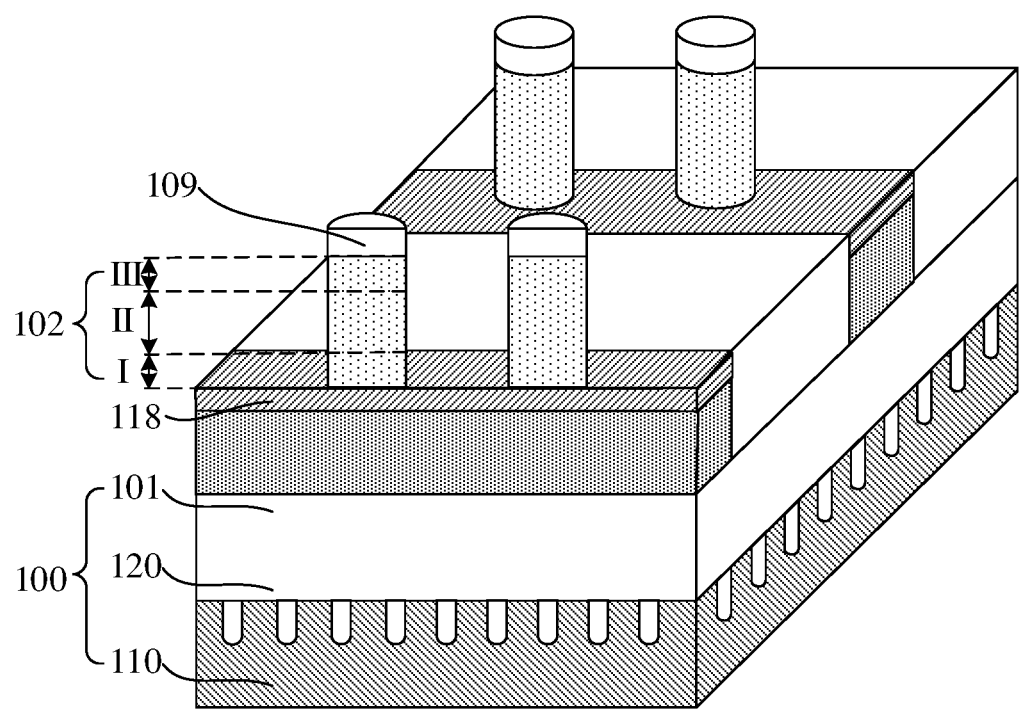

Referring to FIG. 9 and FIG. 10, a semiconductor channel 102 is formed which is located on a partial surface of the metal bit line 101. The semiconductor channel 102 faces the bottom surface of the metal bit line 101 and is electrically connected to the metal bit line 101. In this embodiment, the semiconductor channel 102 is in contact with the first metal layer 118. In other embodiments, the semiconductor channel may be directly in contact with the metal bit line.

Specifically, processes for forming the semiconductor channels 102 include the following operations.

Referring to FIG. 9, an initial channel layer 132 is formed, which is located on the metal bit line 101 and the base 110.

In some embodiments, an isolation layer 130 is provided between adjacent metal bit lines 101, so the initial channel layer 132 covers the surface of the isolation layer 130.

In this embodiment, the first metal layer 118 is formed on the surface of the metal bit line 101, so the initial channel layer 132 covers a surface of the first metal layer 118. In other embodiments, the initial channel layer may directly cover the surface of the metal bit lines.

Specifically, a method for forming the initial channel layer 132 includes chemical vapor deposition, physical vapor deposition, atomic layer deposition or metal organic compound chemical vapor deposition. The material of the initial channel layer 132 is IGZO, IWO or ITO.

Continuing to refer to FIG. 9, a patterned mask layer 109 is formed on a surface of the initial channel layer 132.

The mask layer 109 is used for defining positions and sizes of the subsequently formed semiconductor channels 102. The material of the mask layer 109 may be silicon nitride, silicon carbon nitride or silicon carbon oxynitride. In other embodiments, the material of the mask layer may be a photoresist.

Referring to FIG. 10, the initial channel layer 132 (referring to FIG. 8) is patterned by using the mask layer 109 as a mask to form the semiconductor channels 102.

In a direction from the base 110 to the metal bit lines 101, each semiconductor channel 102 includes a first doped region I, a channel region II, and a second doped region III that are sequentially arranged.

The first doped region I, the channel region II, and the second doped region III in the semiconductor channel 102 are all doped with the same type of doped ions. Such semiconductor channel 102 can be used for forming channels of a junctionless transistor. Problems such as a threshold voltage drift and a leakage current increase caused by an abrupt doping change are avoided. This also helps to inhibit a short channel effect.

It may be understood that the initial channel layer 132 may be doped in advance before patterning. The doping may be doped with N-type ions or P-type ions. The initial channel layer 132 may be doped after patterning, so as to form the semiconductor channels 102 with appropriate ion distribution.

In this embodiment, corner-rounding may be performed on the semiconductor channels 102 by using thermal oxidation, etching and/or hydrogen annealing, to form the semiconductor channels 102 with a cylindrical structure. During the semiconductor structure operates, this helps to prevent a phenomenon of point discharge or electrical leakage from occurring at the semiconductor channels 102.

Figure 11:
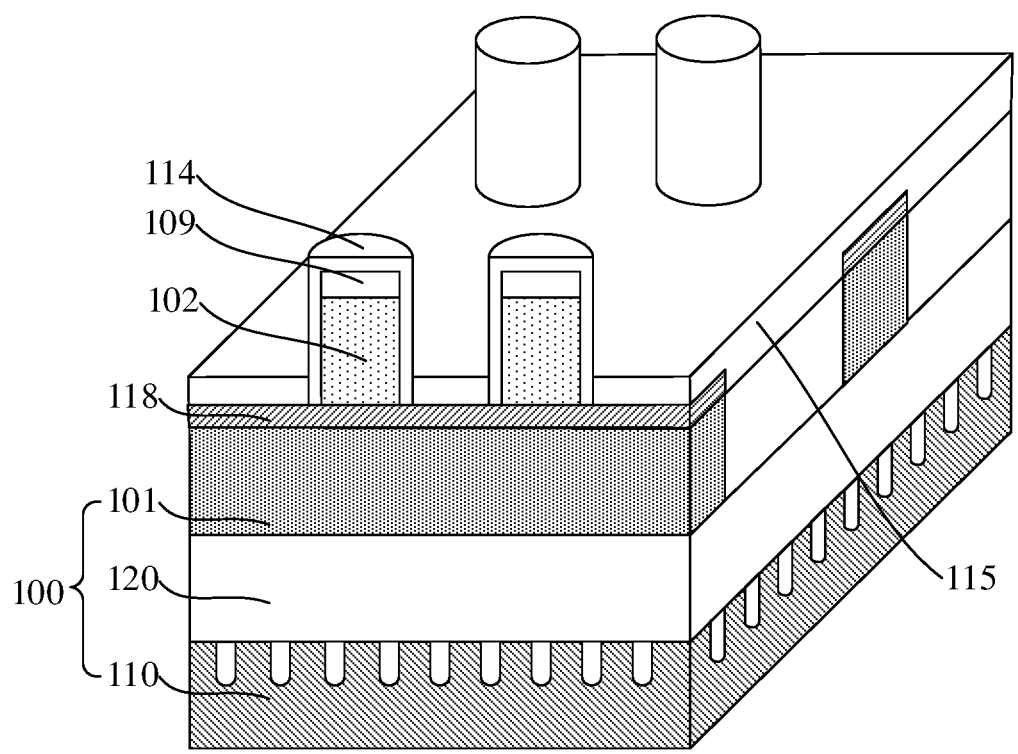

Referring to FIG. 11, a gate dielectric layer 114 is formed on the entire sidewall of each semiconductor channel 102. The gate dielectric layer 114 exposes the surface of the first metal layer 118 other than the position right below the semiconductor channels 102. The gate dielectric layers 114 are used for protecting the semiconductor channels 102 in a subsequent annealing process, so as to prevent the material of the semiconductor channels 102 from reacting with a metal material subsequently.

In this embodiment, the gate dielectric layer 114 is further located on the end surface of the second doped region III away from the base 110. In the operation of subsequently forming the fourth dielectric layer, the gate dielectric layer 114 located on the end surface of the second doped region III away from the base 110 is removed at the same time, to facilitate subsequent formation of the metal layer on the end surface of the second doped region III away from the base 110. In other embodiments, the gate dielectric layer covering the end surface of the second doped region may be removed by etching.

In other embodiments, a gate dielectric layer may be formed only on part of the sidewall surface corresponding the channel region of a semiconductor channel. Or, a gate dielectric layer may be formed on part of the sidewall surface corresponding to the channel region and the first doped region of a semiconductor channel. Or, a gate dielectric layer may be formed on part of the sidewall surface corresponding to the channel region and the second doped region of the semiconductor channel.

Continuing to refer to FIG. 11, a third dielectric layer 115 is formed. The third dielectric layer 115 is located on the surface of the first metal layer 118 away from the base 110, and is located in the intervals between adjacent first metal layers 118.

Specifically, the third dielectric layer 115 is located on the surface of the isolation layer 130 and part of the sidewall surface of the gate dielectric layer 114 corresponding to each first doped region I (referring to FIG. 9) to isolate the first metal layers 118 from the subsequently formed word lines. The third dielectric layer 115 is an integral film layer structure, and is used for preventing electrical interference between the first metal layers 118 and the metal bit lines 101 and the subsequently formed word lines.

Forming the third dielectric layer 115 includes forming an initial first dielectric layer on a surface of the metal bit line 101 away from the base 110; and planarizing and etching back the initial first dielectric layer to a preset thickness, to form the third dielectric layer 115.

Figure 12:
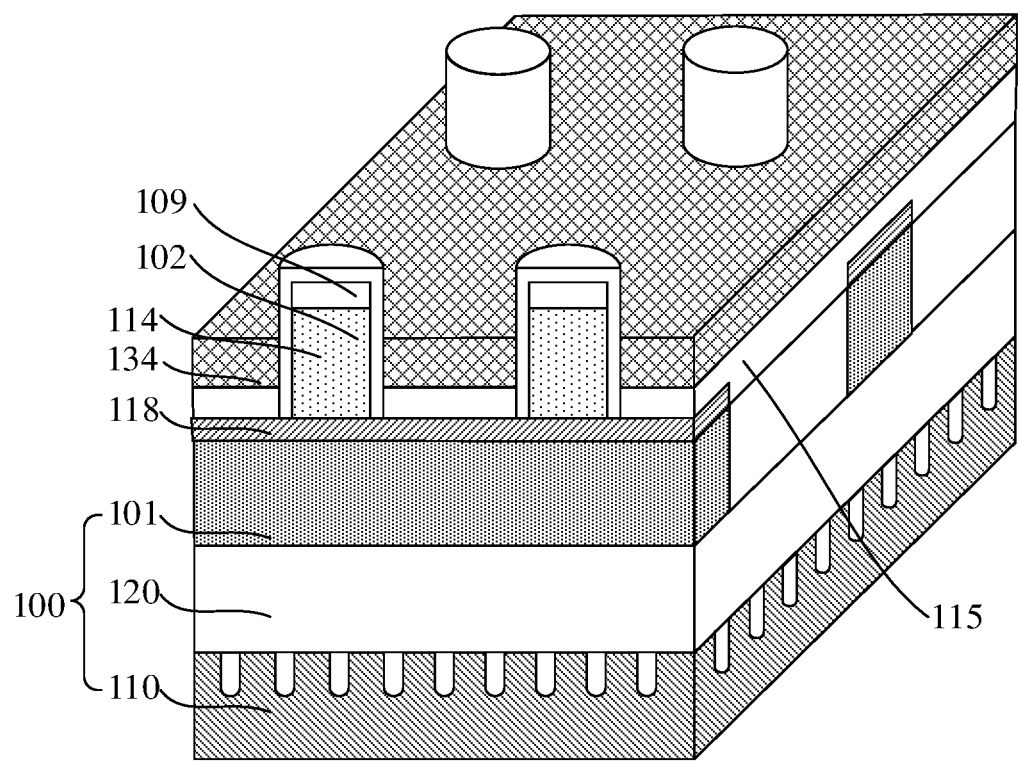

Referring to FIG. 12, an initial gate conductive layer 134 surrounding the channel regions II is formed on sidewall surfaces of the gate dielectric layers 114 corresponding to the channel regions II (referring to FIG. 10). The initial gate conductive layer 134 is a complete film layer structure.

Specifically, a method for forming the initial gate conductive layer 134 includes chemical vapor deposition, physical vapor deposition, atomic layer deposition or metal organic compound chemical vapor deposition. In addition, the initial gate conductive layer 134 is planarized and etched, so as to enable the initial gate conductive layer 134 to be located on part of the sidewall surface of each gate dielectric layer 114 corresponding to the channel region II.

Figure 13:
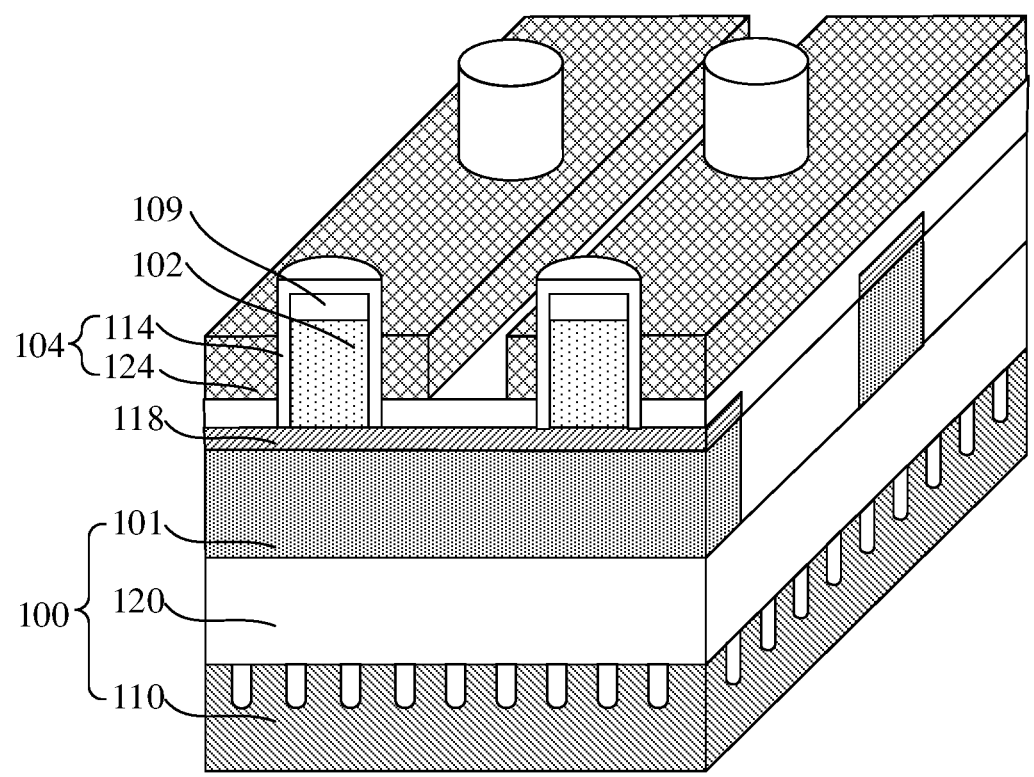

Referring to FIG. 13, the initial gate conductive layer 134 (referring to FIG. 12) is patterned to form gate conductive layers 124 that are spaced apart from each other, to enable the gate conductive layers 124 of different semiconductor channels 102 located on one same metal bit line 101 to be connected to different electric potentials, thereby implementing diversified control of the semiconductor channels. The patterning method includes photolithography.

For each gate dielectric layer 114, each gate dielectric layer 114 may be disposed surrounding at least one the channel region II of the semiconductor channel 102. In FIG. 13, as an example, each gate dielectric layer 114 surrounds two semiconductor channels 102. The number of the semiconductor channels 102 surrounded by each gate dielectric layer 114 may be appropriately set according to an actual electrical requirement.

The gate dielectric layer 114 and the gate conductive layer 124 jointly form the word line 104. Therefore, the word line 104 is also disposed surrounding two semiconductor channels 102.

Figure 14:
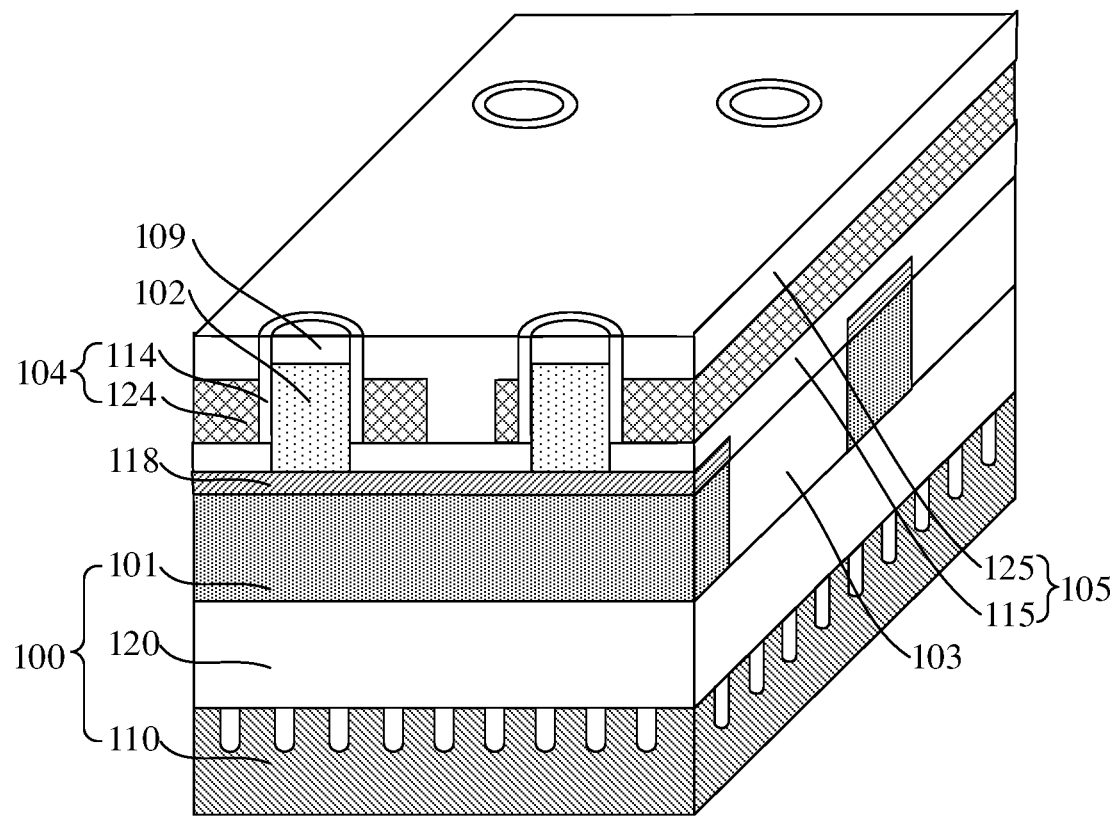

Referring to FIG. 14, a fourth dielectric layer 125 is formed. The fourth dielectric layer 125 is located in the intervals between adjacent gate conductive layers 124, and is used for preventing electrical interference between the adjacent gate conductive layers 124. The fourth dielectric layer 125 is further located on the surfaces of the gate conductive layers 124 away from the base 110, which is used for supporting other conductive structures subsequently formed on the surface of the fourth dielectric layer 125 away from the base 110, and implements insulation between the gate conductive layers 124 and other conductive structures.

In addition, after the fourth dielectric layer 125 is formed, the fourth dielectric layer 125 is planarized. The gate dielectric layer 114 located on the end surfaces of the mask layers 109 away from the base 110 is removed, so as to enable the fourth dielectric layer 125 to expose the mask layer 109 located on the end surfaces of the second doped regions III away from the base 110.

In this embodiment, the third dielectric layer 115 and the fourth dielectric layer 125 jointly form a second dielectric layer 105. The second dielectric layer 105 is located between the metal bit lines 101 and the word lines 104, and is further located on the sides of the word lines 104 away from the base 110. The material of the third dielectric layer 115 is the same as the material of the fourth dielectric layer 125. In this way, it is benefit to reduce types of materials required in a manufacturing process of the semiconductor structure and reduce the costs and complexity of manufacturing the semiconductor structure. In addition, the second dielectric layer 105 further exposes the top surface of the mask layer 109.

Figure 15:
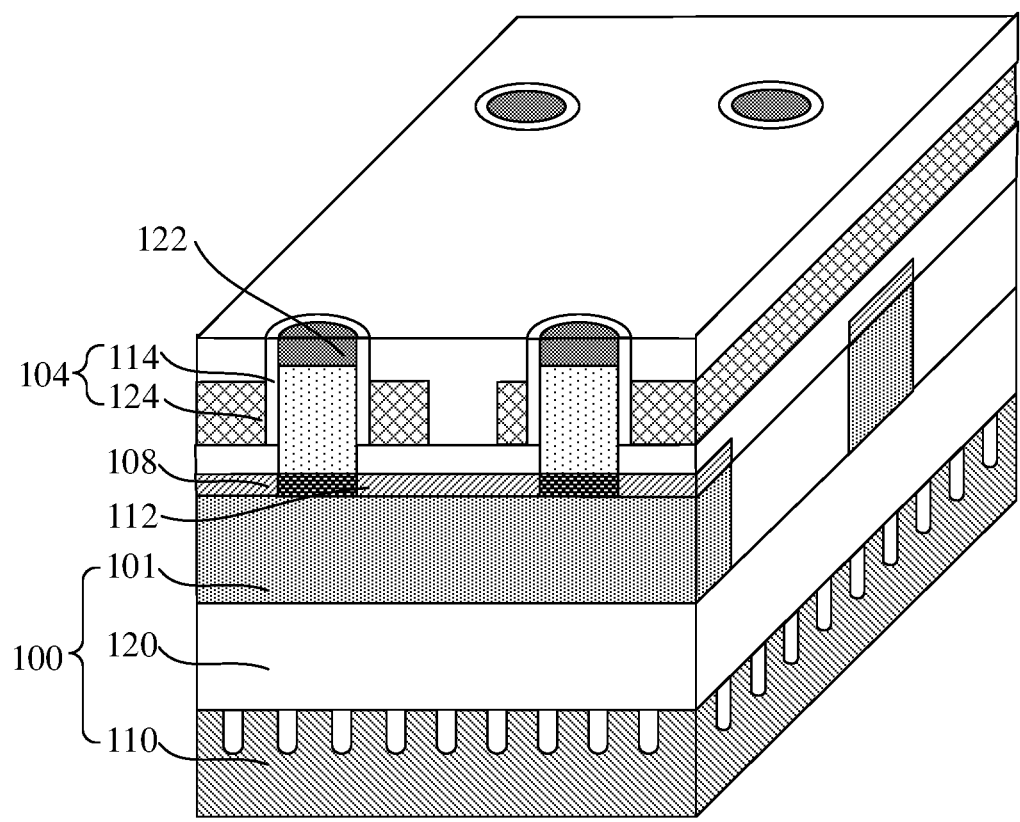

Referring to FIG. 14 to FIG. 15, the mask layer 109 is removed to expose the top surfaces of the second doped regions III (referring to FIG. 10). A second metal layer is formed on the exposed top surface of each second doped regions III.

The second metal layer is used for reacting with the second doped region III, to provide a metal element for subsequent formation of the second metal semiconductor layers 122, thereby reducing the resistivity of the semiconductor channel 102. In which the material of the second metal layer includes at least one of cobalt, nickel or platinum.

The manufacturing method may further include the following operations. A first annealing is performed. The first metal layers 118 react with the first doped regions I to convert a partial thickness of each first doped region I facing the metal bit lines 101 into the first metal semiconductor layer 112. The resistivity of the material of each first metal semiconductor layer 112 is less than the resistivity of the material of the first doped region I other than the first metal semiconductor layer 112.

The parts of each first metal layer 118 that react with the first doped regions I become part of each first doped regions I, and the part of each first metal layer 118 that does not react with the first doped regions I is used as the metal layer 108. It may be understood that a partial thickness of each first metal layer 118 may further remain between the metal bit line 101 and the first metal semiconductor layers 112. The remaining first metal layer 118 is used as the metal layer 108. That is, each metal layer 108 may be located on partial surface of each metal bit lines 101 other than the first metal semiconductor layers 112, and may also be located between the first metal semiconductor layers 112 and the metal bit line 101.

In this embodiment, while performing the first annealing, a second annealing is performed, and each second metal layer reacts with each second doped region III, to convert a partial thickness of each exposed second doped region III into the second metal semiconductor layer 122, and the resistivity of the material of the second metal semiconductor layer 122 is less than the resistivity of the part of each second doped region III other than the second metal semiconductor layer 122.

Specifically, rapid thermal annealing is performed. The process parameters of the rapid thermal annealing include that the semiconductor structure is annealed in an atmosphere of $N_2$, an annealing temperature is 600° C. to 850° C., and an annealing duration is 10 seconds to 60 seconds. Because the annealing temperature is moderate, it is facilitate for the first metal layers 118 to fully react with the first doped regions I, and the second metal layers can fully react with the second doped regions III, so as to form the first metal semiconductor layers 112 and the second metal semiconductor layers 122 with relatively small resistivity. In addition, because the annealing temperature is moderate, this helps to prevent metal elements in the first metal layer 118 and the second metal layer from diffusing into the channel regions II. In addition, annealing is performed in the $N_2$ atmosphere, which helps to prevent oxidation of the first metal layers 118, the second metal layers and the semiconductor channels 102.

In this embodiment, the first annealing and the second annealing are performed at the same time, which helps to simplify the manufacturing processes of the semiconductor structure. In other embodiments, after the semiconductor channels are formed on the first metal layer, the first annealing may be performed. After the second metal layers are formed on the second doped regions, the second annealing is then performed.

In addition, in other embodiments, before the semiconductor channels are formed, a first semiconductor layer may be formed on the surface of each first metal layer. The material of the first semiconductor layer is silicon or germanium. The first semiconductor layer reacts with the first metal layer during the first annealing to form the first metal semiconductor layer. Before the second metal layer is formed, a second semiconductor layer is formed on the top surface of each second doped region. The material of the second semiconductor layer is silicon or germanium. The second semiconductor layer reacts with the second metal layers during the second annealing to form the second metal semiconductor layers.

Referring to FIG. 16 to FIG. 22, a first lower electrode layer 116 is formed, which contacts with a top surface of the semiconductor channel 102. A second lower electrode layer 126 is formed, which is located on a top surface of the first lower electrode layer 116. An upper electrode layer 146 is formed, which is located on a top surface of the second lower electrode layer 126, and surrounds the first lower electrode layer 116 and the second lower electrode layer 126. A capacitor dielectric layer 136 is formed, which is located between the upper electrode layer 146 and the first lower electrode layer 116, and further located between the upper electrode layer 146 and the second lower electrode layer 126.

Specifically, the orthographic projection of the bottom surface of the second lower electrode layer 126 onto the base 110 is located in the orthographic projection of the top surface of the first lower electrode layer 116 onto the base 110. The capacitor dielectric layer 136 covers the top surface and the sides of the second lower electrode layer 126, and further covers the sides of the first lower electrode layer 116 and part of the top surface of the first lower electrode layer 116 exposed by the second lower electrode layer 126.

Specifically, forming the first lower electrode layer 116, the second lower electrode layer 126, the capacitor dielectric layer 136 and the upper electrode layer 146 includes the following operations.

Figure 16:
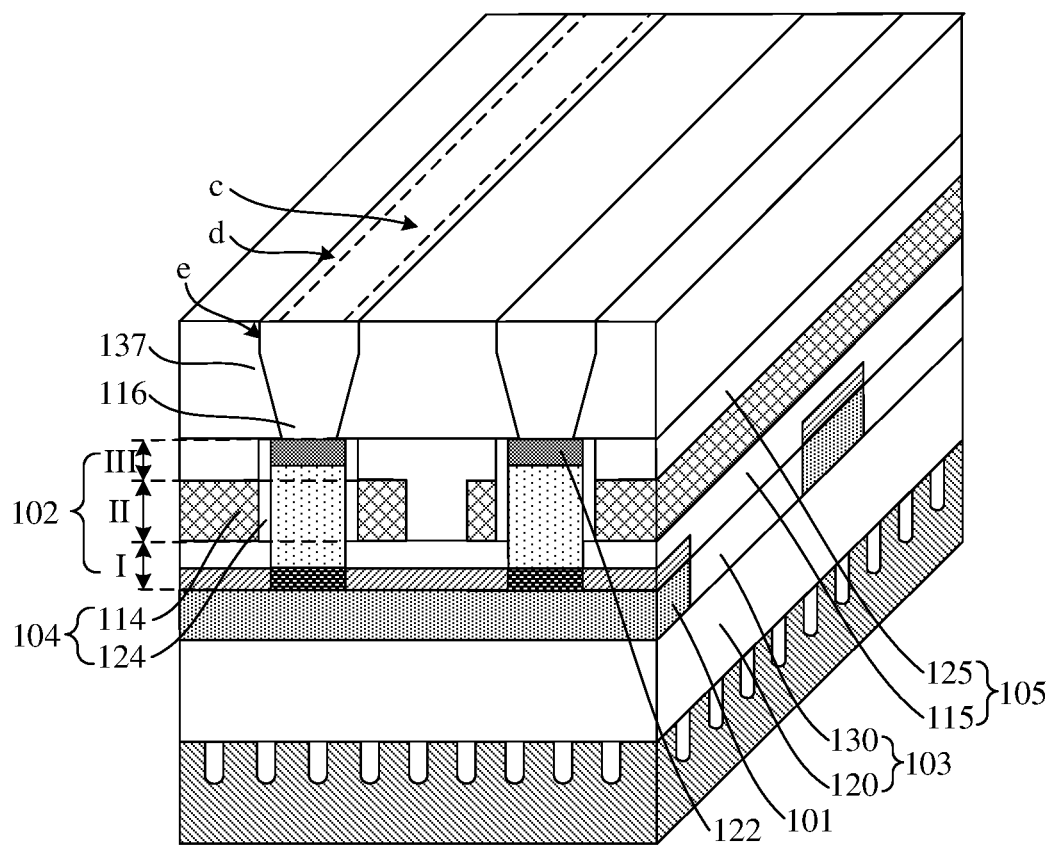

Referring to FIG. 16, the first lower electrode layer 116 is formed. The top surface of the first lower electrode layer 116 includes a central region c and a peripheral region d surrounding the central region c.

Specifically, a sacrifice layer 137 is formed on the side of the second doped region III away from the channel region II. A first through hole e penetrating the sacrifice layer 137 and exposing the second doped region III is provided in the sacrifice layer 137. The first lower electrode layer 116 filling the first through holes e is formed.

The first through hole e includes a first groove and a second groove that are in communication. The first groove exposes the surface of the second doped region III.

Specifically, forming the first groove and the second groove may include the following operations. An initial sacrifice layer is formed on the surface of the second dielectric layer 105. A patterned mask layer is formed on the surface of the initial sacrifice layer. A partial thickness of the initial sacrifice layer is etched by using the patterned mask layer as a mask, to form the second groove. In a region corresponding to the second groove, a part of the initial sacrifice layer exposed from the second groove is etched, until the surface of the second doped region III is exposed, so as to form the first groove with a cross-sectional area in a direction parallel to a surface of the base 110 gradually increasing.

In other embodiments, a sectional shape in the first through hole e may be a rectangle or an inverted trapezoid.

In this embodiment, each word line 104 extends in the second direction. Each word line 104 surrounds two semiconductor channels 102. The first groove and the second groove also extend in the second direction. Specifically, the first through hole e formed by the first groove and the second groove corresponds to one word line 104. That is, each first through hole e exposes the side away from the channel region II of each second doped region III surrounded by the word line 104 corresponding to the first through hole e. In FIG. 16, for example, each first through hole e exposes top surfaces of the second doped regions III of two semiconductor channels 102.

In other embodiments, each first through hole may expose the side of only one second doped region away from the channel region.

Figure 17:
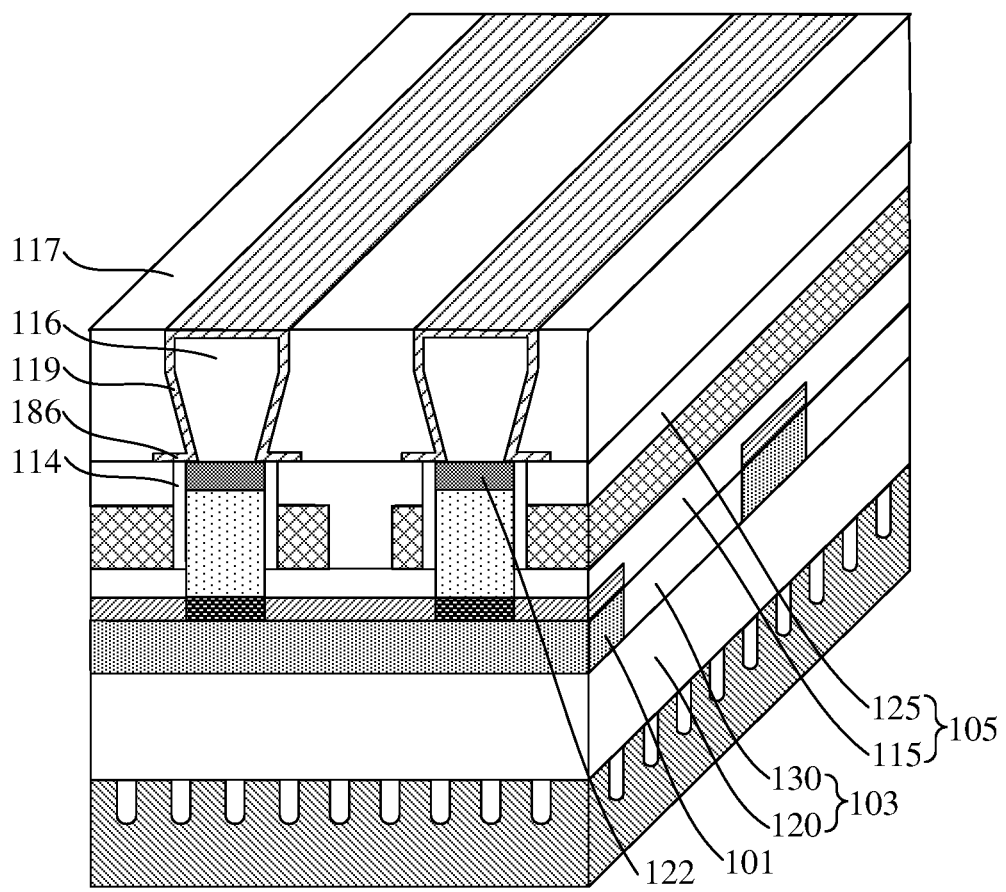

Referring to FIG. 17, a first capacitor dielectric film 119 is formed, which covers the top surface and sides of the first lower electrode layer 116.

In some embodiments, forming the first capacitor dielectric film 119 includes the following operations. The sacrifice layer 137 is removed, and then a first initial capacitor dielectric film with a complete continuous surface is formed. The first initial capacitor dielectric film further covers the top surface and sides of the first lower electrode layer 116. That is, the first initial capacitor dielectric film further covers the fourth dielectric layer 125 exposed from the first lower electrode layer 116, top surfaces of the gate dielectric layer 114 and the second doped region III (referring to FIG. 10).

The first initial capacitor dielectric film is patterned to form the first capacitor dielectric film 119 and a fourth capacitor dielectric layer 186. The fourth capacitor dielectric layer 186 is connected to the bottom surface of the first capacitor dielectric film 119, and extends in the direction away from the axis of the first lower electrode layer 116 perpendicular to the surface of the base 110.

The second lower electrode layer 126 is subsequently formed. Therefore, in a direction perpendicular to the surface of the base 110, an aspect ratio of the first lower electrode layer 116 may be relatively small, so as to improve the stability of the structure of the first lower electrode layer 116. During subsequent formation of other film layers and etching other film layers, the first lower electrode layer 116 is less likely to tilt or collapse, thereby improving the overall stability of the semiconductor structure.

Figure 18:
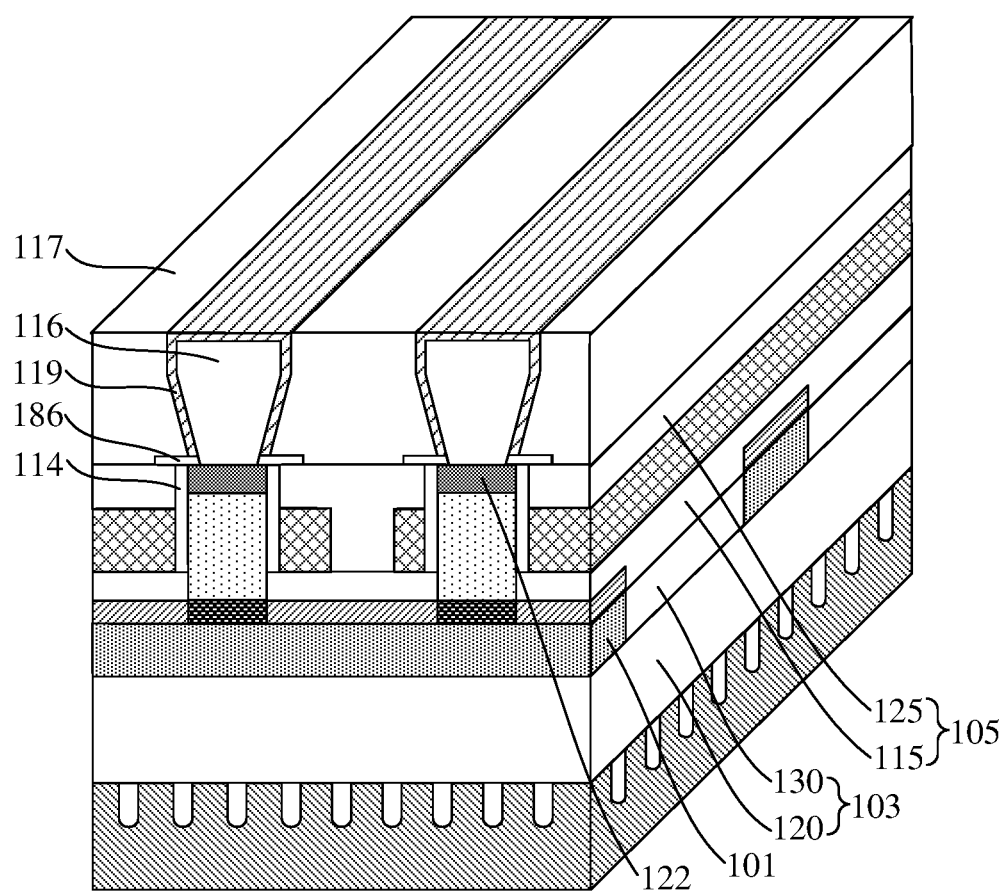

In some other embodiments, referring to FIG. 18, before the first lower electrode layer 116 is formed, the method further includes the following operations. The fourth capacitor dielectric layer 186 is formed on the second dielectric layer 105. The fourth capacitor dielectric layer 186 is provided with an opening penetrating the fourth capacitor dielectric layer 186. The opening exposes at least a part of the top surface of the second doped region III (referring to FIG. 10). In processes of forming the first lower electrode layer 116, the first lower electrode layer 116 fills the opening. The first capacitor dielectric film 119 covering the top surface and sides of the first lower electrode layer 116 is formed.

In other embodiments, a third through hole that penetrates the sacrifice layer and at least exposes the entire top surface of the second doped region may be formed. An initial first capacitor dielectric layer is formed on a sidewall and the bottom of the third through hole. The part of the initial first capacitor dielectric layer located at the bottom of the third through hole is removed, and the remaining first capacitor dielectric layer is used as the first capacitor dielectric layer which defines a fourth through hole. A first lower electrode layer filling the fourth through hole is formed. That is, no second capacitor dielectric layer is provided on the top surface of the first lower electrode layer. The remaining sacrifice layer is used as a first insulating layer.

Referring to FIG. 17 and FIG. 18, a first insulating layer 117 covering the first capacitor dielectric film 119 is formed. The first insulating layer 117 exposes the top surface of the first capacitor dielectric film 119.

In this embodiment, fourth capacitor dielectric layers 186 of adjacent capacitors are separated from each other. That is, the first insulating layer 117 is provided between adjacent fourth capacitor dielectric layers 186. In other embodiments, after the first initial capacitor dielectric film with a complete continuous surface is formed, the first initial capacitor dielectric film may not be patterned. That is, the first initial capacitor dielectric film includes the first capacitor dielectric layer and the fourth capacitor dielectric layer, and the fourth capacitor dielectric layers of adjacent capacitors are in contact with and connected to each other.

Figure 19:
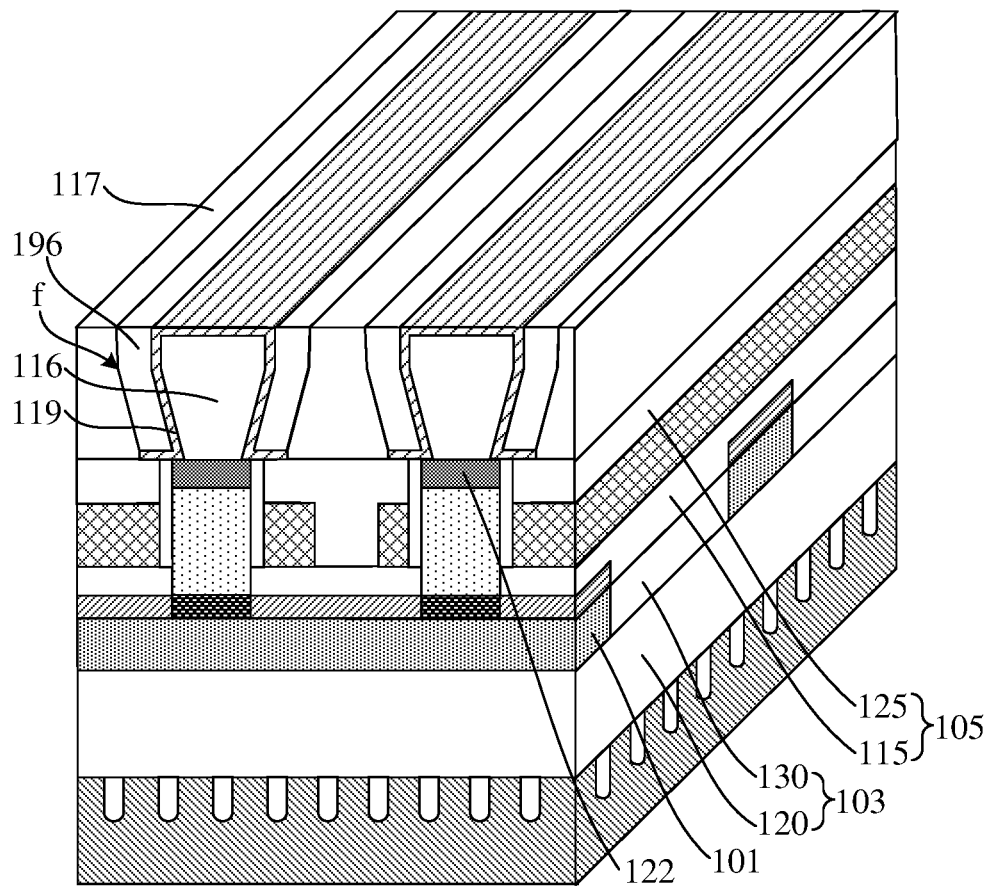

Referring to FIG. 19, a first upper electrode layer 196 is formed. The first upper electrode layer 196 surrounds the first lower electrode layer 116. The first capacitor dielectric film 119 is located between the first upper electrode layer 196 and the first lower electrode layer 116.

Specifically, the first insulating layer 117 is patterned to form a second through hole f surrounding the first lower electrode layer 116. The second through via f exposes sides of the first capacitor dielectric film 119. The first upper electrode layer 196 filling the second through hole f is formed.

Figure 20:
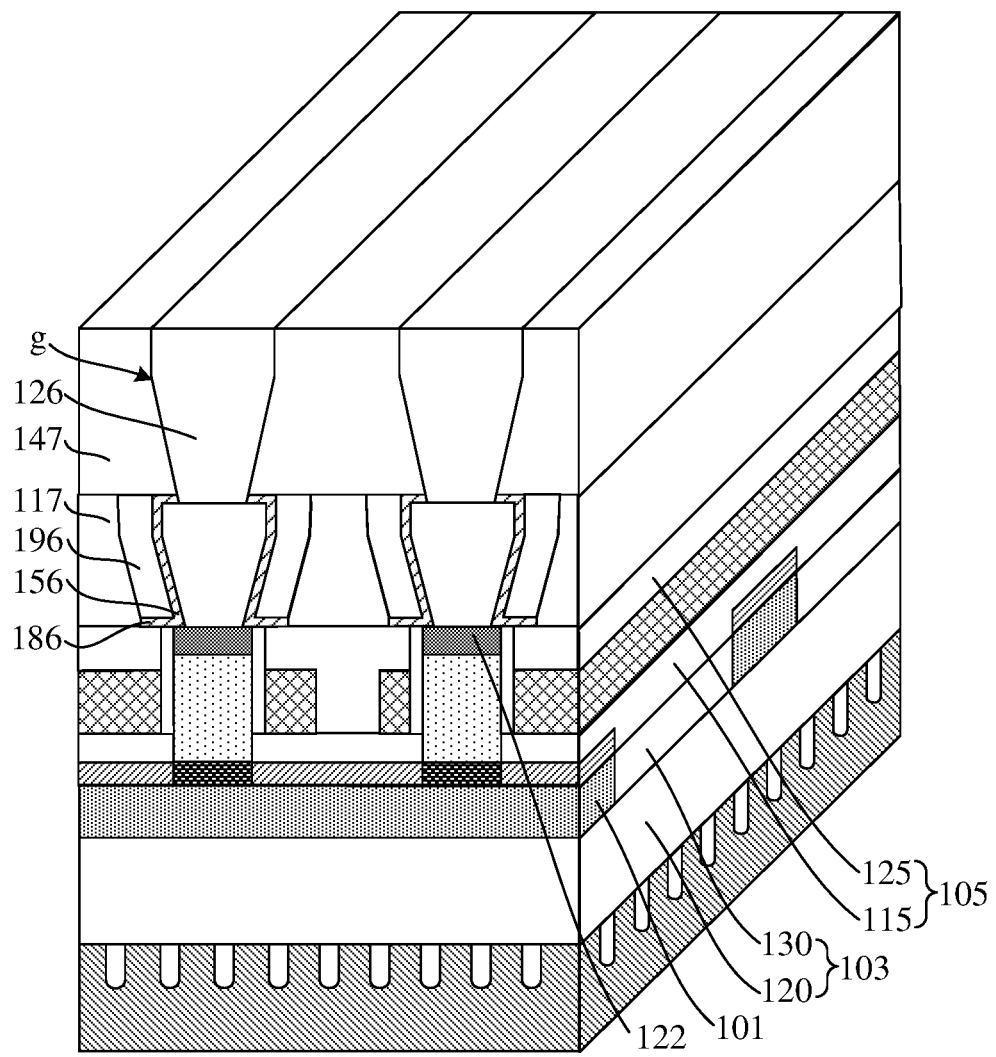

Referring to FIG. 19 and FIG. 20 in combination, the first capacitor dielectric film 119 located in a central region c (referring to FIG. 16) is removed, so as to expose a top surface of the first lower electrode layer 116 in the central region c.

Figure 21:
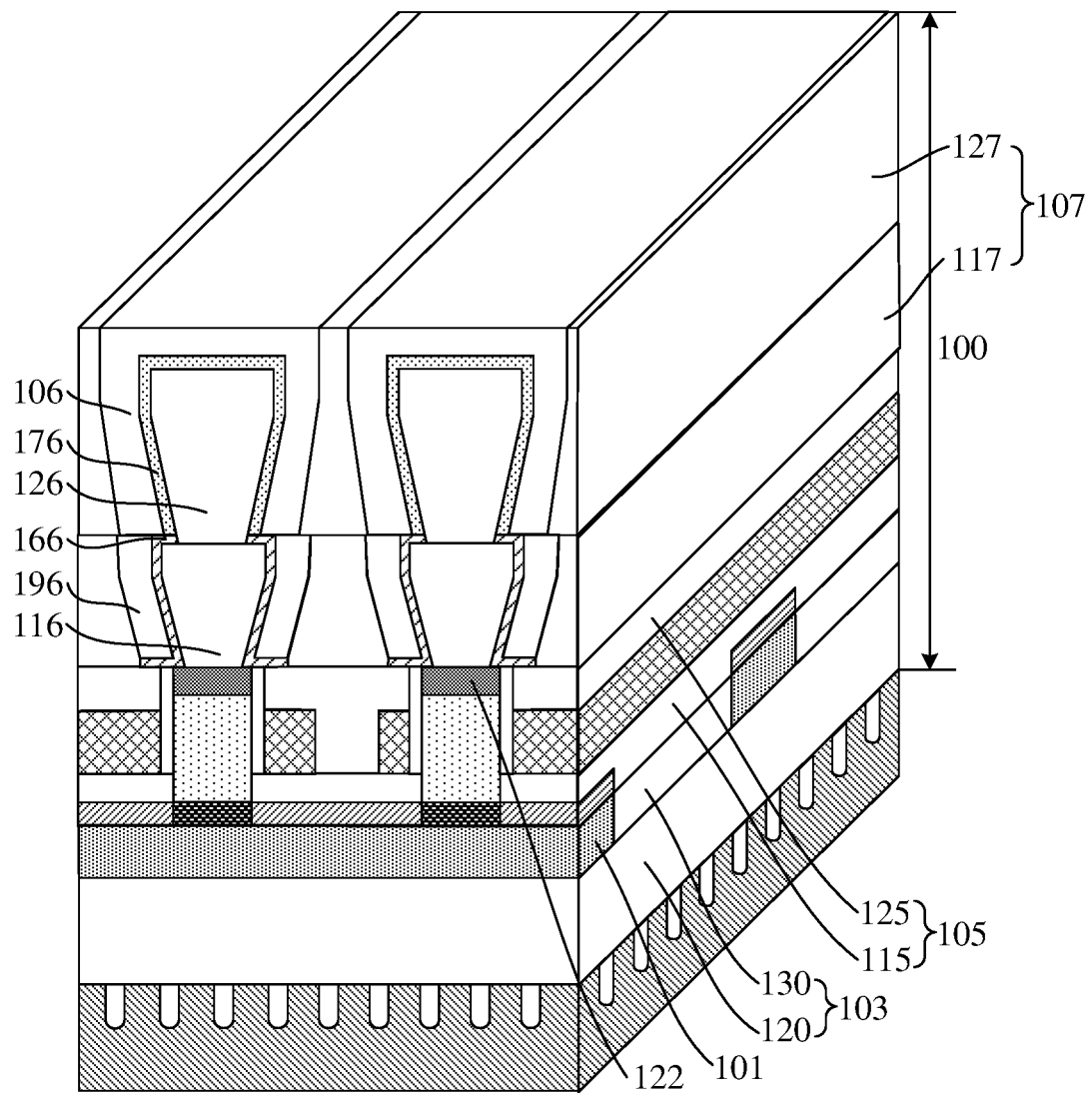
Figure 22:
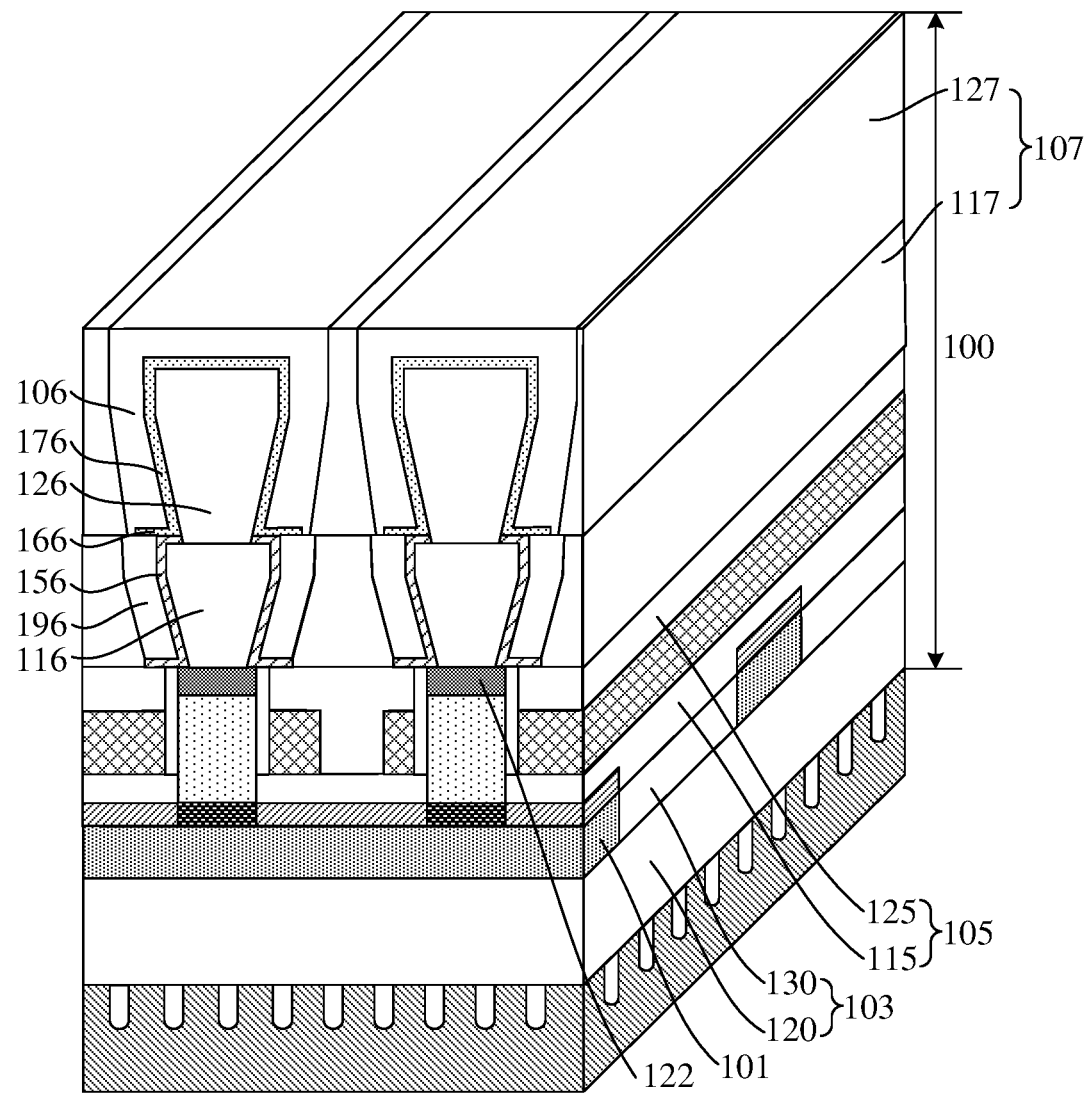

Referring to FIG. 20 to FIG. 22, the second lower electrode layer 126 is formed and is in contact with the top surface of the first lower electrode layer 116 in the central region c (referring to FIG. 16). A third capacitor dielectric layer 176 is formed, which covers the top surface and sides of the second lower electrode layer 126.

In some embodiments, referring to FIG. 21, the part of the first capacitor dielectric film 119 located on the side surfaces of the first lower electrode layer 116 is used as the first capacitor dielectric layer 156. The remaining first capacitor dielectric film 119 located on the top surface of the first lower electrode layer 116 is used as the second capacitor dielectric layer 166. That is, the first capacitor dielectric layer 156 and the second capacitor dielectric layer 166 are an integrally formed structure.

Specifically, referring to FIG. 20, a support layer 147 is formed on a surface jointly formed by the top surface of the first insulating layer 117, the top surface of the first upper electrode layer 196, the top surface of the second capacitor dielectric layer 166 and the top surface of the first lower electrode layer 116. A fifth through hole g that penetrates the support layer 147 and exposes the central region c (referring to FIG. 16) of the first lower electrode layer 116 is formed. The orthographic projection of the fifth through hole g onto the base 110 is located in the orthographic projection of the top surface of the first lower electrode layer 116 onto the base 110. The orthographic projection of the bottom surface of the subsequently formed second lower electrode layer 126 in the fifth through hole g onto the base 110 is located in the orthographic projection of the top surface of the first lower electrode layer 116 onto the base 110. This helps to increase alignment precision between the second lower electrode layer 126 and the first lower electrode layer 116, so as to avoid a misalignment between the second lower electrode layer 126 and the top surface of the first lower electrode layer 116, thereby improving size precision of the eventually formed capacitor, so as to increase the formation quality of the capacitor and to ensure that the capacitor has adequate electrical performance.

The processes for forming the fifth through hole g is the same as those for forming the first through hole e. Details are not described herein again.

Referring to FIG. 21, the third capacitor dielectric layer 176 is formed on the exposed surfaces of the second lower electrode layer 126.

Specifically, the support layer 147 is removed (referring to FIG. 20), and a third initial capacitor dielectric film with a complete continuous surface is formed. That is, the third initial capacitor dielectric film covers the exposed surfaces of the second lower electrode layer 126 and also covers a surface jointly formed by the top surface of the first insulating layer 117, the top surface of the first upper electrode layer 196 and the top surface of the second capacitor dielectric layer 166. The third initial capacitor dielectric film is patterned. Only the third initial capacitor dielectric films kept on the sidewalls and the top surface of the second lower electrode layer 126 are used as the third capacitor dielectric layer 176.

In some other embodiments, referring to FIG. 22, the remaining first capacitor dielectric film 119 located on the side surfaces and the top surface of the first lower electrode layer 116 is used as the first capacitor dielectric layer 156.

Specifically, the processes for forming the second lower electrode layer 126 and the third initial capacitor dielectric film are the same as those in the foregoing embodiments. Details are not described herein again.

During patterning of the third initial capacitor dielectric film, the third initial capacitor dielectric film on the sidewalls and the top surface of the second lower electrode layer 126 is kept as the third capacitor dielectric layer 176, and the third initial capacitor dielectric film located on the top surface of the first capacitor dielectric layer 156 and a part of the top surface of the first upper electrode layer 196 is also kept as the second capacitor dielectric layer 166. That is, the second capacitor dielectric layer 166 and the third capacitor dielectric layer 176 are an integrally formed structure. The second capacitor dielectric layer 166 extends in the direction away from the axis of the second lower electrode layer 126 perpendicular to the surface of the base 110. In this way, this helps to enhance the insulation effect between a subsequently formed second upper electrode layer 106 and the first lower electrode layer 116.

In other embodiments, when no second capacitor dielectric layer is provided on the top surface of the first lower electrode layer, before the second lower electrode layer is formed, the second capacitor dielectric layer film may be at least formed on a peripheral region of the top surface of the first lower electrode layer as the second capacitor dielectric layer, and then the second lower electrode layer is formed. Or, during the formation of the third capacitor dielectric layer 176, the third initial capacitor dielectric film is not patterned. Or, during the formation of the third capacitor dielectric layer 176, the third initial capacitor dielectric films located on the sidewalls and the top surface of the second lower electrode layer 126 and the peripheral region of the top surface of the first lower electrode layer are at least kept.

It needs to be noted that in FIG. 22, as an example, the second capacitor dielectric layers 166 of adjacent capacitors are separated from each other. That is, a second insulating layer 127 is provided between adjacent second capacitor dielectric layers 166. In fact, the second capacitor dielectric layers 166 between adjacent capacitors may be in contact with and connected to each other.

Further, referring to FIG. 21 and FIG. 22, the second insulating layer 127 covering the third capacitor dielectric layer 176 is formed. The second insulating layer 127 is patterned, so as to form a sixth through hole surrounding the second lower electrode layers 126. The sixth through hole exposes the side surfaces and top surface of the third capacitor dielectric layer 176, and exposes the top surface of the first upper electrode layer 196. The second upper electrode layer 106 filling the sixth through hole is formed.

The first insulating layer 117 and the second insulating layer 127 jointly form the insulating layer 107. The first insulating layer 117 is located between adjacent first upper electrode layers 196, and is used for implementing electrical insulation between the adjacent first upper electrode layers 196. The second insulating layer 127 is located between the adjacent second upper electrode layers 106, and covers the upper surface of the first insulating layer 117, so as to use for implementing electrical insulation between the adjacent second upper electrode layers 106.

The first upper electrode layer 196 and the second upper electrode layer 106 jointly form the upper electrode layer 146. The first capacitor dielectric layer 156, the second capacitor dielectric layer 166, the third capacitor dielectric layer 176 and the fourth capacitor dielectric layer 186 jointly form the capacitor dielectric layer 136. The first lower electrode layer 116, the second lower electrode layer 126, the capacitor dielectric layer 136 and the upper electrode layer 146 jointly form a capacitor in the semiconductor structure.

Further, referring to FIG. 1, after one storage unit 100 is formed, a next storage unit 100 may be formed on the side of the storage unit 100 away from the base 110.

In summary, the lower electrode layer of a capacitor is formed by using separate steps, that is, the first lower electrode layer 116 and the second lower electrode layer 126 are formed by separate steps, so that while the stability of the structure of the lower electrode layers is improved, an aspect ratio of the capacitor is increased, thereby increasing a capacitance of the capacitor. In addition, by making the orthographic projection of the bottom surface of the second lower electrode layer 126 onto the base 110 within the orthographic projection of the top surface of the first lower electrode layer 116 onto the base 110, a misalignment between the bottom surface of the second lower electrode layer and the top surface of the first lower electrode layer is avoided, so that both the increase of the capacitance and the improvement of the size precision of a capacitor can be achieved, thereby ensuring that the capacitor has adequate electrical performance.

A person of ordinary skill in the art may understand that the foregoing implementations are specific embodiments for implementing the disclosure, and in actual applications, various changes can be made thereto in forms and details without departing from the spirit and scope of the disclosure. Any person skilled in the art can make changes and modifications without departing from the spirit and scope of the disclosure, and the scope of protection of the disclosure should be as defined by the scope of the claims.

INDUSTRIAL APPLICABILITY

Embodiments of the disclosure provide a semiconductor structure and a method for manufacturing same. In the technical solution provided in the embodiments of the disclosure, a lower electrode layer of a capacitor in the semiconductor structure is formed by stacking a first lower electrode layer and a second lower electrode layer. This helps to increase the overall height of the lower electrode layer of the capacitor, and to increase an aspect ratio of the capacitor, thereby increasing an opposing area between an upper electrode layer and the lower electrode layer in the capacitor, so that the capacitance of the capacitor is increased. Further, the channel region of a semiconductor channel is vertically disposed on the surface of a metal bit line. That is, an extending direction of the channel region is perpendicular to the surface of the metal bit line. A layout space of the semiconductor channel in a direction (usually a horizontal direction) parallel to the surface of the metal bit line is saved without reducing the size of the semiconductor channel, thereby increasing the integration density of the semiconductor structure in the horizontal direction.

The invention claimed is:

1. A semiconductor structure, comprising:
a base and a storage unit located on the base, the storage unit comprising:
a first dielectric layer and a metal bit line located in the first dielectric layer, the first dielectric layer exposing a surface of the metal bit line;
a semiconductor channel, located on a partial surface of the metal bit line, the semiconductor channel facing a bottom surface of the metal bit line and being electrically connected to the metal bit line;
a word line, disposed surrounding a partial region of the semiconductor channel;
a second dielectric layer, located between the metal bit line and the word line, and further located on a side of the word line away from the base;
a first lower electrode layer and a second lower electrode layer, stacked on a top surface of the semiconductor channel away from the metal bit line, the first lower electrode layer contacting the top surface of the semiconductor channel;
an upper electrode layer, located on a top surface of the second lower electrode layer, and surrounding the first lower electrode layer and the second lower electrode layer; and
a capacitor dielectric layer, located between the upper electrode layer and the first lower electrode layer, and further located between the upper electrode layer and the second lower electrode layer;
wherein the capacitor dielectric layer comprises:
a first capacitor dielectric layer, covering a side surface of the first lower electrode layer;
a second capacitor dielectric layer, covering a top surface of the first lower electrode layer exposed from the second lower electrode layer;
a third capacitor dielectric layer, covering the top surface and a side surface of the second lower electrode layer; and
a fourth capacitor dielectric layer, connected to a bottom surface of the first capacitor dielectric layer, and extending in a direction away from an axis of the first lower electrode layer perpendicular to a surface of the base; and the upper electrode layer is further located on a surface of the fourth capacitor dielectric layer.

2. The semiconductor structure according to claim 1, wherein an orthographic projection of a bottom surface of the second lower electrode layer onto the base is located in an orthographic projection of a top surface of the first lower electrode layer onto the base.

3. The semiconductor structure according to claim 1, wherein the capacitor dielectric layer covers the top surface and side surfaces of the second lower electrode layer, and further covers side surfaces of the first lower electrode layer and a top surface of the first lower electrode layer exposed by the second lower electrode layer.

4. The semiconductor structure according to claim 1, wherein the first capacitor dielectric layer and the second capacitor dielectric layer are an integrally formed structure.

5. The semiconductor structure according to claim 1, wherein the fourth capacitor dielectric layer and the first capacitor dielectric layer are an integrally formed structure.

6. The semiconductor structure according to claim 1, wherein the second capacitor dielectric layer is further located on a top surface of the first capacitor dielectric layer, and extends in a direction away from an axis of the second lower electrode layer perpendicular to a surface of the base.

7. The semiconductor structure according to claim 1, wherein the upper electrode layer comprises:
a first upper electrode layer, surrounding the first lower electrode layer, and located on a side surface of the first capacitor dielectric layer; and
a second upper electrode layer, surrounding the second lower electrode layer, located on a surface of the third capacitor dielectric layer, and a bottom surface of the second upper electrode layer being in contact with a top surface of the first upper electrode layer.

8. The semiconductor structure according to claim 1, wherein a relative dielectric constant of a material of the capacitor dielectric layer is greater than a relative dielectric constant of a material of the second dielectric layer.

9. The semiconductor structure according to claim 1, wherein the semiconductor structure comprises at least two storage units stacked on the base.

10. The semiconductor structure according to claim 1, wherein a material of the semiconductor channel at least comprises one or more of Indium Gallium Zinc Oxide (IGZO), Indium Tungsten Oxide (IWO) or Indium Tin Oxide (ITO); and the semiconductor channel is used for forming a channel of a junctionless transistor.

11. The semiconductor structure according to claim 1, wherein in a direction from the base to the metal bit line, the semiconductor channel comprises a first doped region, a channel region and a second doped region that are sequentially arranged; the first doped region is electrically connected to the metal bit line; the word line is disposed surrounding the channel region; and the first lower electrode layer is in contact with a side of the second doped region away from the channel region.

12. The semiconductor structure according to claim 1, wherein the word line comprises:
a gate dielectric layer, surrounding an entire sidewall surface of the semiconductor channel; and a gate conductive layer, disposed surrounding a partial region of the semiconductor channel, the gate dielectric layer being located between the semiconductor channel and the gate conductive layer.

13. A method for manufacturing a semiconductor structure, comprising:
providing a base;
forming a storage unit on the base, which comprises:
providing a first dielectric layer and a metal bit line located in the first dielectric layer, wherein the first dielectric layer exposes a surface of the metal bit line;
forming a semiconductor channel located on a partial surface of the metal bit line, wherein the semiconductor channel faces a bottom surface of the metal bit line and is electrically connected to the metal bit line;
forming a word line, wherein the word line is disposed surrounding a partial region of the semiconductor channel;
forming a second dielectric layer, wherein the second dielectric layer is located between the metal bit line and the word line, and is further located on a side of the word line away from the base;
forming a first lower electrode layer, wherein the first lower electrode layer is in contact with a top surface of the semiconductor channel;
forming a second lower electrode layer, wherein the second lower electrode layer is located on a top surface of the first lower electrode layer;
forming an upper electrode layer, wherein the upper electrode layer is located on a top surface of the second lower electrode layer, and surrounding the first lower electrode layer and the second lower electrode layer; and
forming a capacitor dielectric layer, wherein the capacitor dielectric layer is located between the upper electrode layer and the first lower electrode layer, and is further located between the upper electrode layer and the second lower electrode layer;
wherein forming the first lower electrode layer, the second lower electrode layer, the capacitor dielectric layer, and the upper electrode layer comprise:
forming the first lower electrode layer, wherein a top surface of the first lower electrode layer comprises a central region and a peripheral region surrounding the central region;
forming a first capacitor dielectric film, wherein the first capacitor dielectric film covers the top surface and side surfaces of the first lower electrode layer;
forming a first upper electrode layer, wherein the first upper electrode layer surrounds the first lower electrode layer, and the first capacitor dielectric film is located between the first upper electrode layer and the first lower electrode layer;
removing the first capacitor dielectric film located in the central region, to expose the top surface of the first lower electrode layer in the central region, wherein the first capacitor dielectric film located on side surfaces of the first lower electrode layer is used as a first capacitor dielectric layer, the remaining first capacitor dielectric film located on the top surface of the first lower electrode layer is used as a second capacitor dielectric layer;
forming the second lower electrode layer, wherein the second lower electrode layer is in contact with the top surface of the first lower electrode layer in the central region; and
forming a third capacitor dielectric layer, wherein the third capacitor dielectric layer covers the top surface and side surfaces of the second lower electrode layer.

14. The manufacturing method according to claim 13, wherein forming the first capacitor dielectric film comprises:
forming a first initial capacitor dielectric film with a complete continuous surface, wherein the first initial capacitor dielectric film further covers the top surface and side surface of the first lower electrode layer; and
patterning the first initial capacitor dielectric film, to form the first capacitor dielectric film and a fourth capacitor dielectric layer, wherein the fourth capacitor dielectric layer is connected to the bottom surface of the first capacitor dielectric film, and extending in a direction away from an axis of the first lower electrode layer perpendicular to a surface of the base.

15. The manufacturing method according to claim 13, wherein in a direction from the base to the metal bit line, the semiconductor channel comprises a first doped region, a channel region and a second doped region that are sequentially arranged; forming the first lower electrode layer, the first capacitor dielectric film and the first upper electrode layer comprise:
forming a sacrifice layer on a side of the second doped region away from the channel region, wherein first through hole penetrating through the sacrifice layer and exposing the second doped region is provided in the sacrifice layer;
forming the first lower electrode layer filling the first through hole;
removing the sacrifice layer, and forming the first capacitor dielectric film;
forming a first insulating layer covering the first capacitor dielectric film, wherein the first insulating layer exposes the top surface of the first capacitor dielectric film;
patterning the first insulating layer, to form a second through hole surrounding the first lower electrode layer, wherein the second through hole exposes side surfaces of the first capacitor dielectric film; and
forming the first upper electrode layer filling the second through hole.

16. The manufacturing method according to claim 13, wherein before the forming the first lower electrode layer, the method further comprises: forming a fourth capacitor dielectric layer on the second dielectric layer, wherein the fourth capacitor dielectric layer is provided with an opening penetrating the fourth capacitor dielectric layer; and in a process of forming the first lower electrode layer, the first lower electrode layer fills the opening.

* * * * *